(12) United States Patent
Mills et al.

(10) Patent No.: US 6,599,147 B1
(45) Date of Patent: Jul. 29, 2003

(54) HIGH-DENSITY REMOVABLE EXPANSION MODULE HAVING I/O AND SECOND-LEVEL-REMOVABLE EXPANSION MEMORY

(75) Inventors: Kevin J. Mills, Palo Alto, CA (US); Michael L. Gifford, San Leandro, CA (US)

(73) Assignee: Socket Communications, Inc., Newark, CA (US)

( * ) Notice: Subject to any disclaimer, the term of this patent is extended or adjusted under 35 U.S.C. 154(b) by 0 days.

(21) Appl. No.: 09/439,966

(22) Filed: Nov. 12, 1999

Related U.S. Application Data

(63) Continuation-in-part of application No. 09/309,373, filed on May 11, 1999, now Pat. No. 6,353,870.

(51) Int. Cl.[7] .............................................. H01R 13/64
(52) U.S. Cl. ....................... 439/377; 439/946; 439/76.1
(58) Field of Search ................................ 439/377, 946, 439/74, 75, 76.1; 361/737, 752, 796, 683

(56) References Cited

U.S. PATENT DOCUMENTS

| | | | |
|---|---|---|---|
| 4,744,006 A | 5/1988 | Dufield ........................ 361/686 |
| 5,049,728 A | 9/1991 | Rovin .......................... 235/492 |
| 5,184,282 A | 2/1993 | Kaneda et al. ............... 361/395 |
| 5,291,584 A | 3/1994 | Challa et al. ................ 395/500 |
| 5,491,774 A | 2/1996 | Norris et al. ................ 395/2.79 |
| 5,519,577 A | 5/1996 | Dudas et al. ................ 361/737 |
| 5,545,057 A | 8/1996 | Tan et al. ................. 439/540.1 |
| 5,550,709 A | 8/1996 | Iwasaki ....................... 361/684 |
| 5,563,400 A | 10/1996 | Le Roux .................... 235/486 |
| 5,566,290 A | 10/1996 | Silverbrook ................ 395/173 |
| 5,579,430 A | 11/1996 | Grill et al. .................. 395/2.12 |
| 5,611,055 A | 3/1997 | Krishan et al. ............. 395/281 |
| 5,611,057 A | 3/1997 | Pecone et al. .............. 710/102 |
| 5,615,344 A | 3/1997 | Corder ........................ 395/309 |

(List continued on next page.)

OTHER PUBLICATIONS

*MultiMediaCard System Summay Version 2.0*, MMCA, Jan. 1999.
Wes Brewer, *Smart Solutions for Smart Phones*, SanDisk Corporation, 1998.
*CompactFlash Specification Revisoin 1.3*CompactFlash Association, 1998.
*PC Cards and CompactFlash Size CF+ Cards and Ethernet, Serial Communications, Bar Code Scanning and Data Collection*, Socket Communications, Inc., 1998.
*SanDisk CompatFlash*, SanDisk Corporation, Apr. 1998.
*SanDisk MultiMediaCard*, SanDisk Corporation, Nov. 1997.
Apr. 30, 2001 PCT Written Opinion for related International application No. PCT/US00/12796, filed May 9, 2000.

* cited by examiner

*Primary Examiner*—P. Austin Bradley
*Assistant Examiner*—Edwin A. León
(74) *Attorney, Agent, or Firm*—PatentVentures; Bennett Smith; Korbin Van Dyke

(57) ABSTRACT

The utility of portable computer hosts, such as PDAs (or handhelds), is enhanced by methods and apparatus for removable expansion cards having application specific circuitry, a second-level-removable memory, and optional I/O, in a number of illustrative embodiments. In addition to providing greater expansion utility in a compact and low profile industrial design, the present invention permits memory configuration versatility for application specific expansion cards, permitting easy user field selection and upgrades of the memory used in conjunction with the expansion card. Finally, from a system perspective, the present invention enables increased parallelism and functionality previously not available to portable computer devices.

36 Claims, 37 Drawing Sheets

U.S. PATENT DOCUMENTS

| | | | |
|---|---|---|---|
| 5,619,396 A | 4/1997 | Gee et al. | 361/686 |
| 5,661,635 A | 8/1997 | Huffman et al. | 361/684 |
| 5,663,901 A | 9/1997 | Wallace et al. | 365/52 |
| 5,671,374 A | 9/1997 | Postman et al. | 395/309 |
| 5,675,734 A | 10/1997 | Hair | 395/200.01 |
| 5,679,007 A | 10/1997 | Poldevin et al. | 439/76.1 |
| 5,752,857 A | 5/1998 | Knights | 439/638 |
| 5,818,030 A | 10/1998 | Reyes | 235/492 |
| 5,839,108 A | 11/1998 | Daberko et al. | 704/270 |
| 5,876,218 A | 3/1999 | Liebenow et al. | 439/74 |
| 5,887,145 A | 3/1999 | Harari et al. | 395/282 |
| 5,892,213 A | 4/1999 | Ito et al. | 235/441 |
| 5,906,516 A * | 5/1999 | Sato et al. | 439/630 |
| 5,928,347 A | 7/1999 | Jones | 710/129 |
| 5,933,328 A * | 8/1999 | Wallace et al. | 257/678 |
| 6,002,605 A | 12/1999 | Iwasaki et al. | 365/51 |
| 6,053,748 A | 4/2000 | Bricaud et al. | 439/76.1 |
| 6,085,412 A | 7/2000 | Iwasaki | 29/827 |
| 6,091,137 A | 7/2000 | Fukada | 257/679 |
| 6,097,605 A | 8/2000 | Klatt et al. | 361/737 |
| 6,102,714 A * | 8/2000 | Oliphant et al. | 439/131 |
| 6,222,726 B1 * | 4/2001 | Cha | 361/683 |
| 6,293,464 B1 * | 9/2001 | Smalley, Jr. | 235/435 |

\* cited by examiner

Legend

| Pin No. | Name | Type | Description |
|---|---|---|---|
| 1 | RSV | NC | Reserved for future use |
| 2 | CMD | I/O/Push-Pull/Open-Drain | Command/Response |
| 3 | $V_{SS1}$ | Supply | Supply voltage ground |
| 4 | $V_{DD}$ | Supply | Supply voltage |
| 5 | CLK | I | Clock |
| 6 | $V_{SS2}$ | Supply | Supply voltage ground |
| 7 | DAT | I/O/Push-Pull | Data |

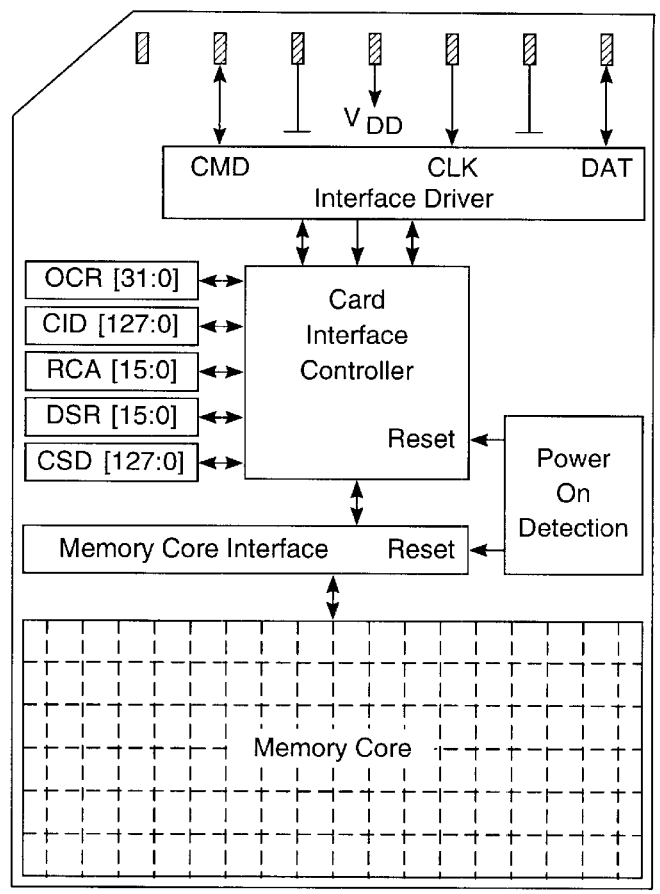

FIG. 6
(PRIOR ART)

Legend

| Name | Width | Description |
|---|---|---|
| CID | 128 | Card identification number, card individual number for identification. Mandatory. |
| RCA | 16 | Relative card address, local system address of a card, dynamically assigned by the host during initialization. Mandatory. |
| DSR | 16 | Driver stage register to configure the card's output drivers. Optional. |
| CSD | 128 | Card specific data, information about the card operation conditions. Mandatory. |
| OCR | 32 | Operation condition register for cards which do not support the full voltage range. Used by a special broad-cast command to detect restricted cards. Optional. |

FIG. 7
(PRIOR ART)

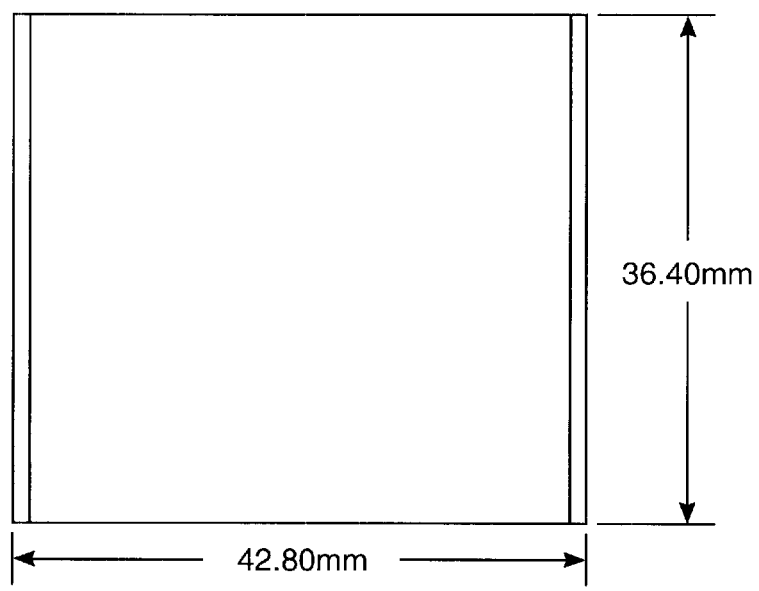
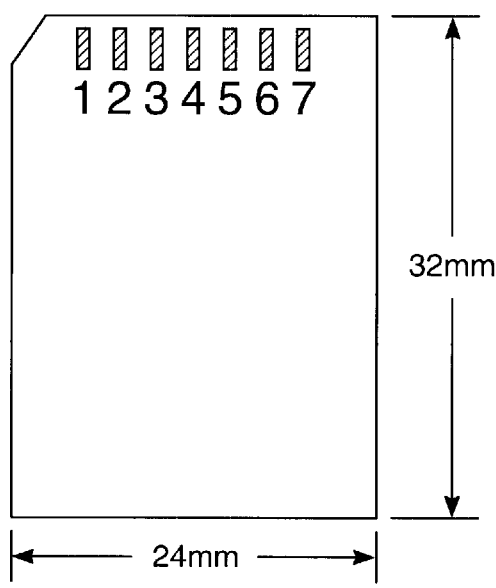
FIG. 10
(PRIOR ART)

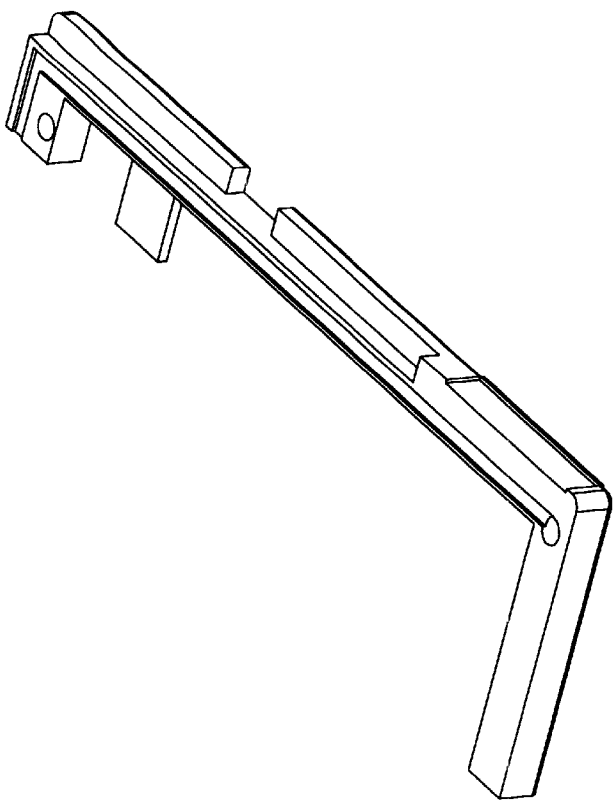
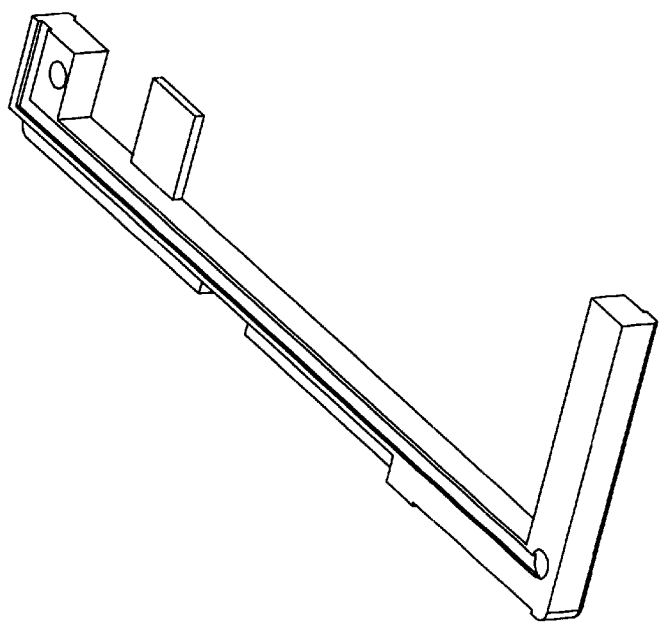
FIG. 28
(PRIOR ART)

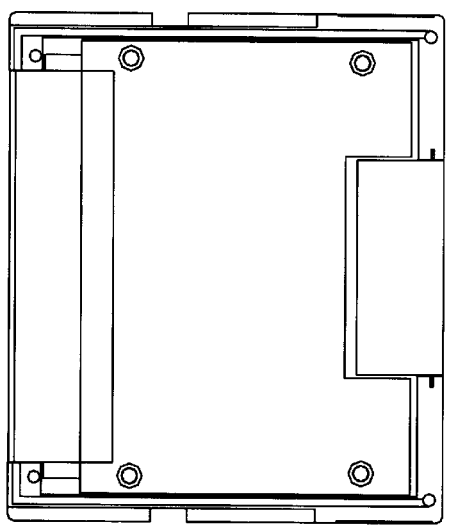
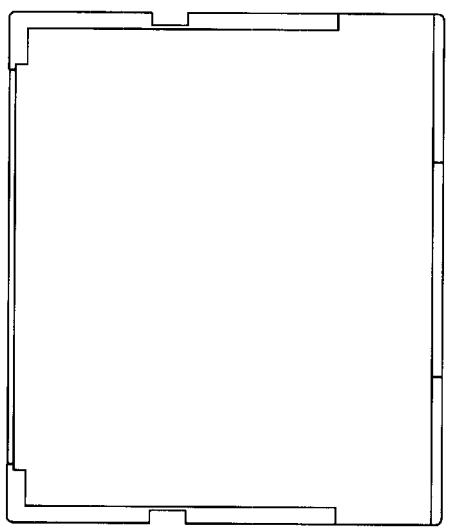
FIG. 33

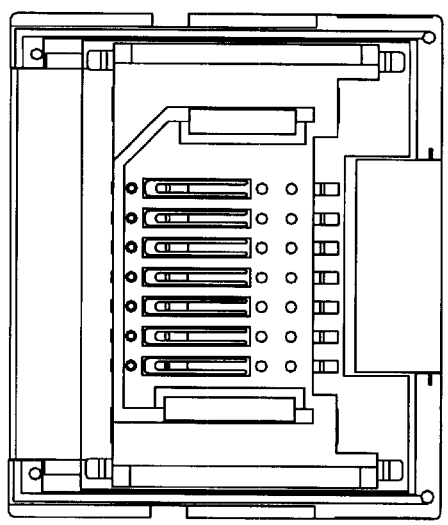
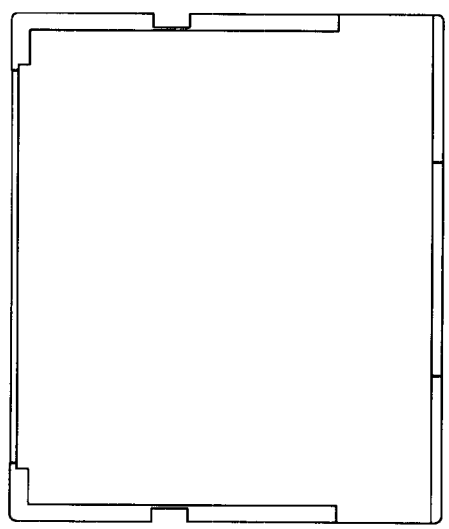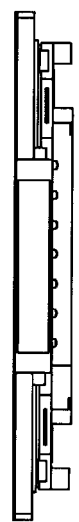
FIG. 34

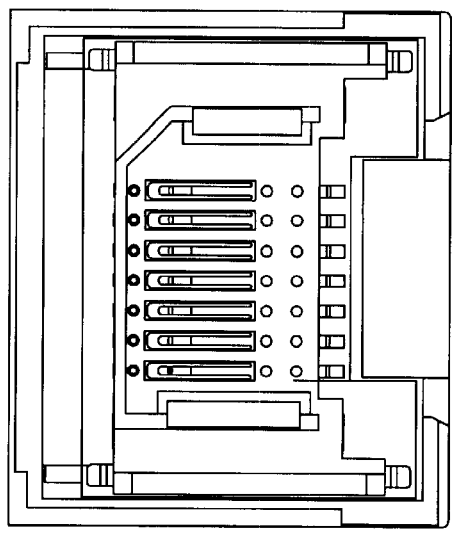
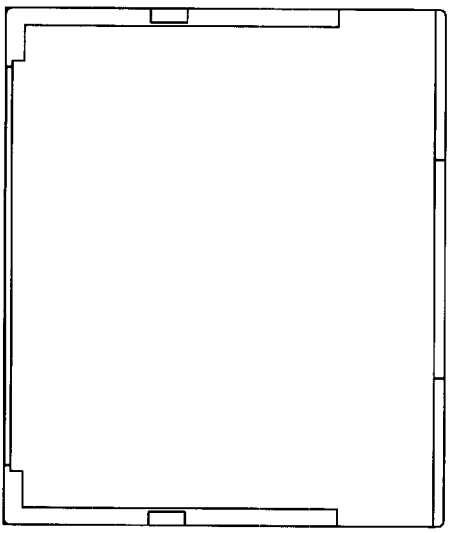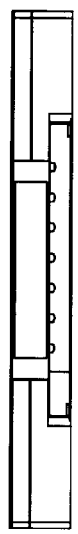
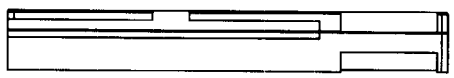
FIG. 35

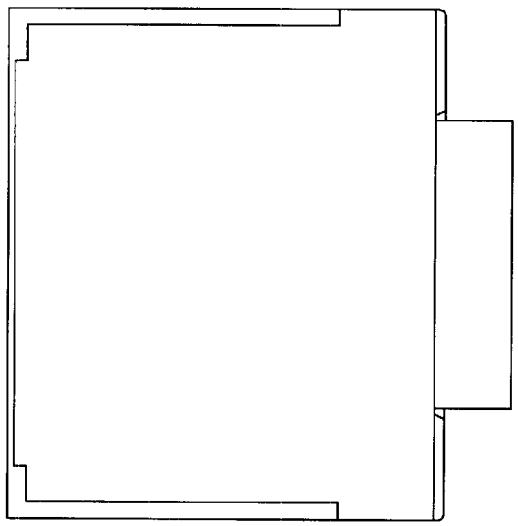
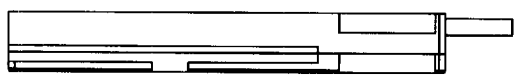
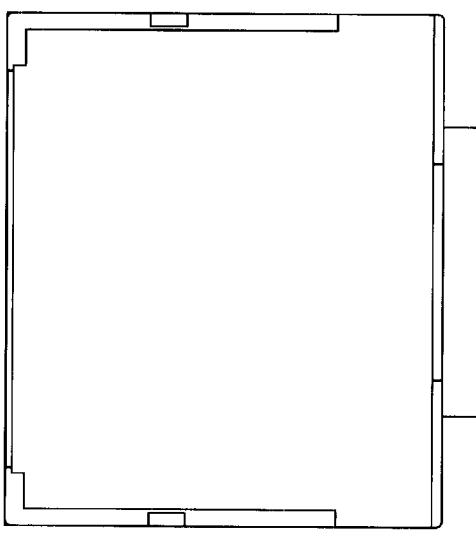
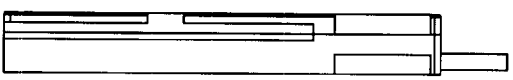
FIG. 36

HIGH-DENSITY REMOVABLE EXPANSION MODULE HAVING I/O AND SECOND-LEVEL-REMOVABLE EXPANSION MEMORY

CROSS-REFERENCE TO RELATED APPLICATIONS

This patent application is a continuation-in-part of the following commonly owned and U.S. patent application: U.S. application Ser. No. 09/309,373, CLOSED-CASE REMOVABLE EXPANSION CARD HAVING I/O AND REMOVABLE MEMORY, filed May 11, 1999 now U.S. Pat. No. 6,353,870, which is incorporated by reference herein.

FIELD

The invention is related to removable expansion modules or cards for computer hosts, such modules having particular application to portable computing hosts such as handheld computing devices.

BACKGROUND

The broad use of portable host computers, including laptops, notebooks, palmtops, Personal Digital Assistants (PDAs), and handheld computers (handhelds), has been severely hampered by limited capabilities for expansion or customization. Expansion and application customization has been performed via only one, or at most two, slots for removable expansion modules for I/O, I/O adapters, memories, and memory adapters.

Memory expansion cards have included DRAM, SRAM, ROM, and Flash technologies. I/O expansion modules have included dedicated peripherals, networking, modems, wireless communications, serial I/O, and bar-code and other scanners.

Having only one slot meant choosing between memory or peripheral expansion. In two-slot implementations, one of the slots is generally used for peripheral expansion, and the other for memory expansion. As market forces and consumer demand are pushing future PDAs to be ever smaller, allocating packaging volume for two-slots will be increasingly viewed as a costly and nonviable solution.

If not further qualified, a general reference in this specification and the attached claims to the terms "expansion module" or "expansion card," and possibly prefaced by "removable," should be construed as a general reference to a class of generally enclosed compact expansion devices that provide fast, reliable, and robust repeated field insertion, removal, handling, and storage, ideally suited for closed-case, user-serviceable, plug-in expansion of portable and handheld computing devices. If not further qualified, a general reference in this specification and the attached claims to the term "slot," should be construed as a reference to the physical and electrical means by which a portable computing device receives a removable expansion module of the class just defined. A reference in this specification and the attached claims to the terms "closed-case," or "sealed-case," serves to indicate that insertion and removal of an expansion device does not involve significant reconfiguration or removal of the external casing of the computing device. Closed-case is not meant to foreclose the possible user removal of a protective access panel or the user opening of a hinged access door. Nor is it meant to foreclose that the casing may need to be removed for more significant events best performed by a qualified service person.

Memory and Expansion Module Standards

Two of the most popular industry standards for the slots and removable cards are the PC Card and the CompactFlash Card. The PC Card has a 16-bit variant, previously known as a PCMCIA card, and a newer 32-bit variant, also known as a Card-Bus card. PC Cards include Type I, Type II, and Type III devices. If not further qualified, a general reference to PC Cards in this specification and the attached claims should be construed to refer to any of the Card-Bus (32-bit), PCMCIA (16-bit), Type I, Type II, or Type III PC Card variants.

U.S. Pat. No. 5,815,426 ('426), ADAPTER FOR INTERFACING AN INSERTABLE/REMOVABLE DIGITAL MEMORY APPARATUS TO A HOST DATA PART, assigned to Nexcom Technology, and hereby incorporated by reference, describes these and other removable expansion card and memory types suitable for PDAs. In addition to the PC Card and CompactFlash Card formats, the '426 patent includes discussions of and references to Miniature Cards, Sold State Floppy Disk Cards (SSFDCs), MultiMediaCards (MMC), Integrated Circuit (IC) Cards (also known as Smart Cards), and Subscriber Identification Module (SIM) Cards.

CompactFlash Standards

FIGS. 1, 2, and 3 are different views of a prior art Type II CompactFlash Card. The physical, electrical, and software interface architecture of CompactFlash Cards (CF+ Cards and CF Cards) is taught in the CompactFlash Specification Revision 1.3, Copyright 1998, and the CF+ and Compact-Flash Specification Revision 1.4, Copyright 1999, both by the CompactFlash Association (CFA), P.O. Box 51537, Palo Alto, Calif. 94303, and both of which are hereby incorporated by reference. FIGS. 1, 2, 3, part of 10, and part of 11 are reproduced or derived from the CompactFlash Specification Revision 1.3 document. Strictly speaking, Compact-Flash nomenclature uses CF to denote cards that are primarily limited to flash data storage, and uses CF+ to denote cards that may have any or all off flash data storage, I/O devices, and magnetic disk data storage. CF and CF+ cards presently include Type I (3.3 mm thick) and Type II (5 mm thick) devices. Both Type I and Type II CF cards are 36.4 mm long by 42.8 mm wide, or roughly "matchbook-sized." A Type III device is being defined as discussed in a later section herein. If not further qualified, a general reference to CompactFlash (or CF) in this specification and the attached claims should be construed to refer to any of the CF, CF+, Type I, Type II, or Type III CompactFlash variants.

U.S. Pat. No. 5,887,145 ('145), REMOVABLE MOTHER/DAUGHTER PERIPHERAL CARD, assigned to SanDisk Corporation, and hereby incorporated by reference, describes the required features of host systems for CompactFlash Cards, including controllers required by CompactFlash memory cards (CF cards) and comprehensive controllers required by CompactFlash memory and I/O cards (CF+ cards).

MultiMediaCard

FIGS. 4 and 5 represent a prior art MultiMediaCard form factor and its pad definitions. FIGS. 6 and 7 represent the prior art internal architecture of a generic MultiMediaCard and its registers. FIG. 8 illustrates the prior art functional partitioning of a generic MultiMediaCard system. FIG. 9 illustrates the prior art physical partitioning of a generic MultiMediaCard system.

The MMC and MMC related system issues are taught in the MultimediaCard System Summary Version 2.0, Copyright January 1999, by the MultiMediaCard Association, 19672 Stevens Creek Blvd., #404, Cupertino, Calif. 95014-2465, which is hereby incorporated by reference. FIGS. 4, 5, 6, 7, 8, 9, and part of 10 are reproduced or derived from the MultimediaCard System Summary document.

FIGS. 10 and 11 are different views comparing the form factors of the prior art CompactFlash Card (top) and MultiMediaCard (bottom). In each of 10 and 11, the CompactFlash Card and the MultiMediaCard are both roughly to equal scale.

Adapters for Removable Memories

Adapters exist or have been prophetically disclosed for physically and electrically coupling a removable memory on a slide, or stick, to a portable host via a removable expansion card of either the PCMCIA Card or CompactFlash Card form factors. The previously mentioned '426 patent describes such removable memory adapters. The focus of these existing memory adapters has been limited to merely providing an interface adapter, or bridge, between a first interface type (the host to removable-expansion-card interface) and a second interface type (the removable memory stick).

PC Card Mother and CompactFlash Card Daughter Combinations

Adapters exist or have been prophetically disclosed that comprise a special mother PC Card designed to accept one or more daughter CompactFlash Cards of one or more types. The previously '145 patent describes such CompactFlash adapters. The focus of these existing mother/daughter combinations has also been limited. First, the daughters have been used for memory expansion for the host platform, primarily in the form of flash-memory-based mass-storage-like devices. In this first approach, the mother card provides the requisite mass-storage controller functionality. Second, the daughters have been used for dedicated peripheral, I/O, or communication functions. In this second approach, the mother card has a so-called comprehensive controller that augments the mass-storage controller functionality with functions commonly required or useful to multiple daughter cards. Third, in a variation of either of the first two paradigms, functions of the general-purpose host may be relocated to the mother card.

Open-Back Module Expansion Standards

The previously discussed expansion module (or card) implementations have been of a first type wherein the module is mated with a closed-back mother device by (full or partial) insertion into a receiving chamber that is inside the external casing of the mother device. The chamber usually is of a standardized minimum width and insertion depth. The module insertion into the chamber is facilitated by edge-guides internal to the chamber and insertion is (usually) via a standardized minimum width×minimum height circumscribed portal (mouth, or orifice) in the mother device's external casing. The chamber portal is sometimes protected by a hinged or removable access panel or by a stub (a dummy card with an external end flanged to block off most of the portal) inserted into the chamber. According to this first type, the modules are designed to have dimensions compatible with the insertion depth×width, edge guides, and width×height orifice of the chamber.

For hand-held computer or PDA applications, a second type of expansion card also exists. The second type of expansion card makes use of a "open-back" (or open-face) industrial design approach previously applied to other hand-held devices, such as cellular telephones. In open-back hand-held devices, a standardized back-mount is made integral to the device. Families of removable components (such as batteries), varying widely size and make-up but otherwise interchangeable, are designed to be compatible to the standardized back-mount. For open-back devices, the industrial design form-factor (appearance and volume) becomes a function of both the device and the mated component.

As applied to a hand-held mother device, an open-face expansion module is mated with a companion open-back device by (full or partial) insertion into a receiving recess of (usually) standardized width×minimum depth that is integral to, but substantially on the outside of, the device. The module insertion into the recess is via (usually) standardized module-edge guides incorporated into the open recess of the device. In a manner not unlike that for cards in closed-back expansion applications, open-face modules are designed to have dimensions compatible with the width×minimum depth and edge guides of the device recess. But since the recess of an openback device by definition has no circumscribed portal, the module height and shape are largely unrestricted. Instead the height and shape of the interchangeable modules are restricted only by bounds imposed by practical utility, bounds imposed to avoid mechanical interference with other objects in common system configurations, and bounds imposed by ergonometric concerns.

Expansion modules for the Handspring Visor handheld computer are an example of open-face expansion modules. These modules are designed in accordance with the Handspring Springboard expansion slot. The technology of the Springboard slot is publicly disclosed in a number of documents published on the Handspring Web-Site (http:\\www.handspring.com). "The Springboard Platform," is a Handspring "white-paper" that broadly summarizes the technology. "Development Kit for Handspring Handheld Computers," Release 1.0, Document No. 80-0004-00, printed in 1999, gives a detailed description targeted at developers of Springboard modules. Open-face functionality is also proposed for next generation CompactFlash Type III (CF+ Type III) devices, whose specification is presently being defined by a working group within the Compact Flash Association. More specifically, the CF+ Type III devices are expected to enable handhelds to continue to use the present 50-pin CompactFlash bus and connector but make use of an open-back industrial design philosophy.

Background for Expansion Module Based I/O Functions

Techniques are known in the art for making and using systems that perform I/O functions in an expansion module. For example, see U.S. Pat. No. 5,671,374 ('374), PCMCIA INTERFACE CARD COUPLING INPUT DEVICES SUCH AS BARCODE SCANNING ENGINES TO PERSONAL DIGITAL ASSISTANTS AND PALMTOP COMPUTERS, assigned to TPS Electronics, which is hereby incorporated by reference. The '374 patent teaches the use of PDAs and similar hosts equipped with PC card interfaces for I/O devices including portable laser-scanners, magnetic stripe and ink readers, keyboards and keypads, OCR devices, and trackballs.

Techniques are also known in the art for making and using PC Card-based radios for applications based in a portable host. For example, see U.S. Pat. No. 5,519,577 ('577), SPREAD SPECTRUM RADIO INCORPORATED IN A PCMCIA TYPE II CARD HOLDER, assigned to Symbol Technologies, and hereby incorporated by reference.

Techniques are also known in the art for making and using disk emulation devices based on flash memory. For example, see U.S. Pat. No. 5,291,584 ('584), METHODS AND APPARATUS FOR HARD DISK EMULATION, assigned to Nexcom Technology, and hereby incorporated by reference.

Background for Relevant Application Specific Functions

Techniques are known in the art for making and using systems that download or capture compressed digital audio for storage and later playback using dedicated removable media. For example, U.S. Pat. No. 5,676,734 ('734), SYSTEM FOR TRANSMITTING DESIRED DIGITAL VIDEO OR AUDIO SIGNALS, assigned to Parsec Sight/Sound, and hereby incorporated by reference, teaches a system for transmitting digital video or audio signals over a telecommunications link from a first to a second party. In addition, U.S. Pat. No. 5,579,430 ('430), DIGITAL ENCODING PROCESS, assigned to Fraunhofer Gesellschaft zur Foerderung der angewandten Forschung e.V., and hereby incorporated by reference, teaches processes for encoding digitized analog signals. Such processes are useful for insuring high-quality reproduction while reducing transmission bandwidth and data storage requirements.

Techniques are also known in the art for making and using record and playback portable host devices based on a dedicated flash memory. For example, see U.S. Pat. No. 5,491,774 ('774), HANDHELD RECORD AND PLAYBACK DEVICE WITH FLASH MEMORY, assigned to Comp General Corporation, and hereby incorporated by reference, and U.S. Pat. No. 5,839,108 ('108), FLASH MEMORY FILE SYSTEM IN A HANDHELD RECORD AND PLAYBACK DEVICE, assigned to Norris Communications, also hereby incorporated by reference.

Limitations of Previous Approaches

In general purpose portable hosts, populating a finite-volume expansion slot has meant choosing one of either removable memory or peripheral expansion for that slot. When used for memory expansion, the removable memory has been limited to use for the system or application software running on the host. In essence, the removable memory has only been used as host-dedicated memory. This was done either directly, e.g., as some portion of the main-memory of the host, or indirectly as an emulation substitute for host mass-storage (i.e., disk drives). When used for I/O expansion, the expansion I/O-cards have not had access to a private removable media/memory. This has prevented portable computer hosts, such as PDAs, from being used as a customizable platform for many application-specific functions that require a removable memory dedicated to the application.

In general purpose portable hosts, populating a open-volume expansion slot has meant choosing one of either removable memory or peripheral expansion for that slot.

SUMMARY

The utility of portable computer hosts, such as PDAs (or handhelds), is enhanced by methods and apparatus for removable expansion cards having application specific circuitry, a second-level-removable memory, and optional I/O, in a number of illustrative embodiments. The term "second-level" is intended to emphasize that while the expansion module is removable from a computer host at a first level of functionality, the expansion memory is independently removable from the expansion module, providing a second level of functionality. In addition to providing greater expansion utility in a compact and low profile industrial design, the present invention permits memory configuration versatility for application specific expansion cards, permitting easy user field selection and upgrades of the memory used in conjunction with the expansion card. Finally, from a system perspective, the present invention enables increased parallelism and functionality previously not available to portable computer devices.

In one illustrative embodiment the removable memory is in combination with an external-I/O connector or permanently attached external-I/O device, providing both I/O and memory functions in a single closed-case removable expansion card.

This increases the expansion functional density for portable computer hosts, such as PDAs. That is, it increases the amount of functionality that can be accommodated within a given volume allocation for expansion devices. It also provides a viable alternative to 2-slot implementations.

In another illustrative embodiment the removable memory is a private memory for application specific circuitry within the closed-case-removable expansion card. This enhances the utility of portable computer hosts, such as PDAs, as universal chassises for application specific uses.

Some of the illustrative embodiments make use of a Type II CompactFlash form factor, another uses a Type I form factor, but as discussed below, the invention is not limited to these particular form factors or to the CompactFlash expansion bus. As will be seen, the physical and electrical interface of the chosen expansion bus couples the expansion modules to the host, which may provides user interface functions for application specific modules.

The modules according to some illustrative embodiments of the present invention include an end located slot and an internal connector for accepting a MultiMediaCard (MMC) as the private removable memory. Another embodiment instead uses a top-cavity to accept a MMC flush with the top of the module, capturing the MMC in place when the module is inserted into a PDA.

In addition, the application specific card will generally have some manner of I/O to required external devices, such as scanning devices, sensors, or transducers. Otherwise, all functionality for the application specific function is self-contained within the application specific card.

Particular application specific cards for customizing general purpose PDAs via the instant invention include a media-player card for digitized media stored on removable memory and a bar-code-scanner card having scanning data stored on removable memory.

BRIEF DESCRIPTION OF DRAWINGS

FIGS. 6 and 7 represent the prior art internal architecture of a generic MultiMediaCard and its registers.

FIGS. 10 and 11 compares the form factors of the prior art CompactFlash card (top) and MultiMediaCard (bottom).

FIG. 28 is an axonometric projection of a prior art CF Type II bottom case, comprising the lower section of FIG. 27 with a metal panel bottom.

FIG. 33 is a multiview orthographic projection of the assembly of FIG. 29.

FIG. 34 is a multiview orthographic projection of the assembly of FIG. 30.

FIG. 35 is a multiview orthographic projection of the assembly of FIG. 31.

FIG. 36 is a multiview orthographic projection of the assembly of FIG. 35 with a metal top, forming the complete CF Type II module, together with an inserted MMC.

DETAILED DESCRIPTION

Components of the Expansion Card

Figure 16:
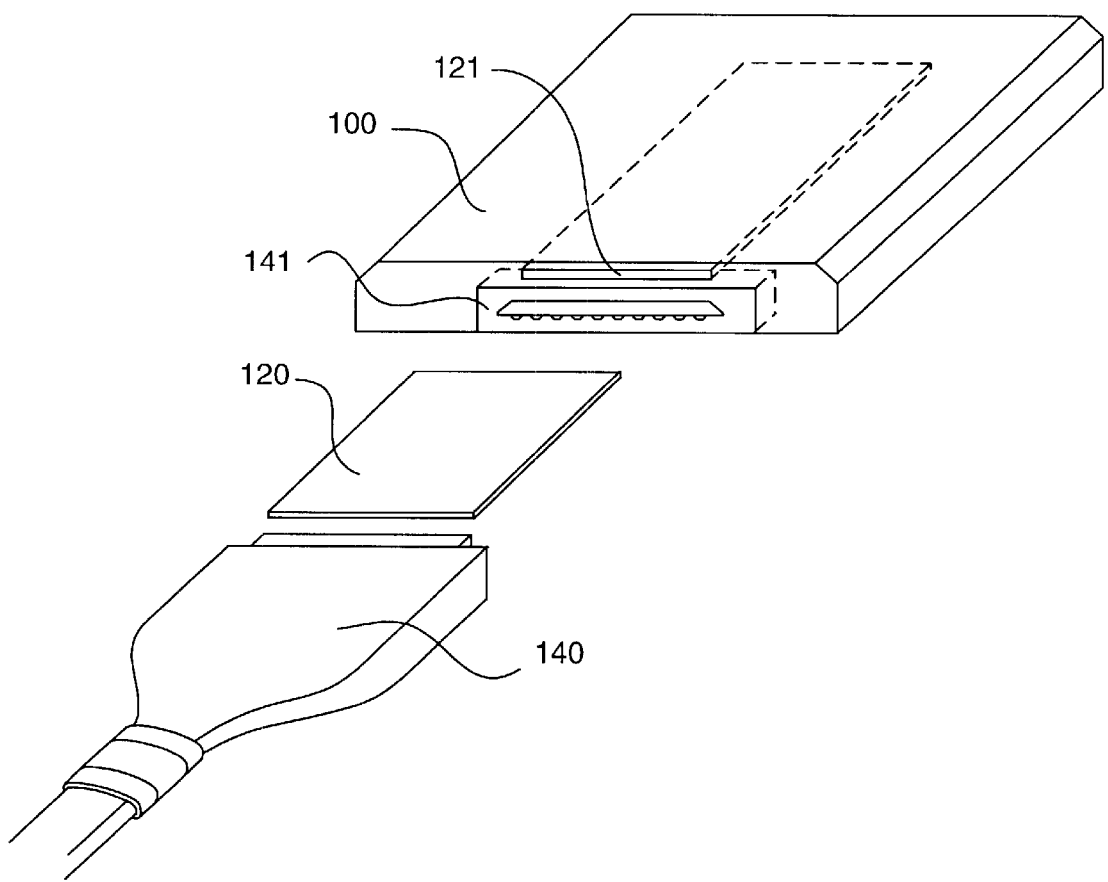
FIG. 16 is an abstract drawing representing the removable expansion card of FIG. 12 separate from the PDA, and with the I/O and memory disengaged from the removable expansion card.

FIG. 16 is an abstract drawing representing a closed-case removable expansion card 100, i.e., an expansion card that may be inserted into and removed out of a closed-case computer host. The card is especially suitable for use in a portable host, such as a PDA. In accordance with the present invention, the expansion card of FIG. 16 includes a connector 141 for I/O interconnect and a slot 121 for a removable memory. FIG. 16 shows the I/O interconnect 140 and removable memory 120 disengaged from the removable expansion card.

Figure 17:
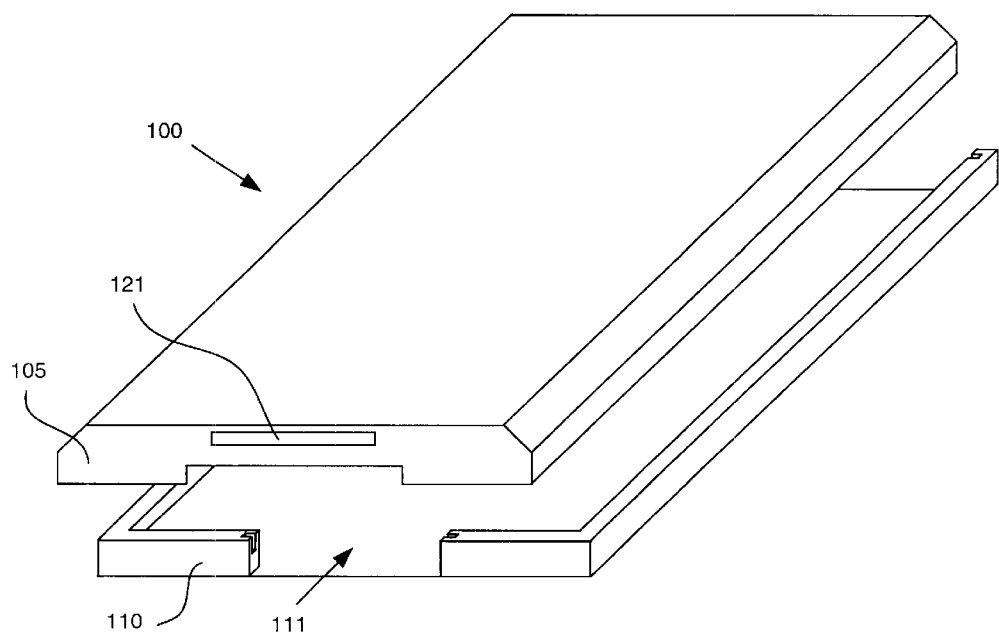
FIG. 17 is an abstract drawing representing the construction detail of the upper and lower frame of the removable expansion card of FIG. 12.

FIG. 17 is an abstract drawing representing the construction detail of the upper 105 and lower 110 frame members of the removable expansion card 100 of FIG. 16. An opening 111 is provided in the lower frame 110 for receiving the connector 141 for I/O interconnect.

Figure 18:
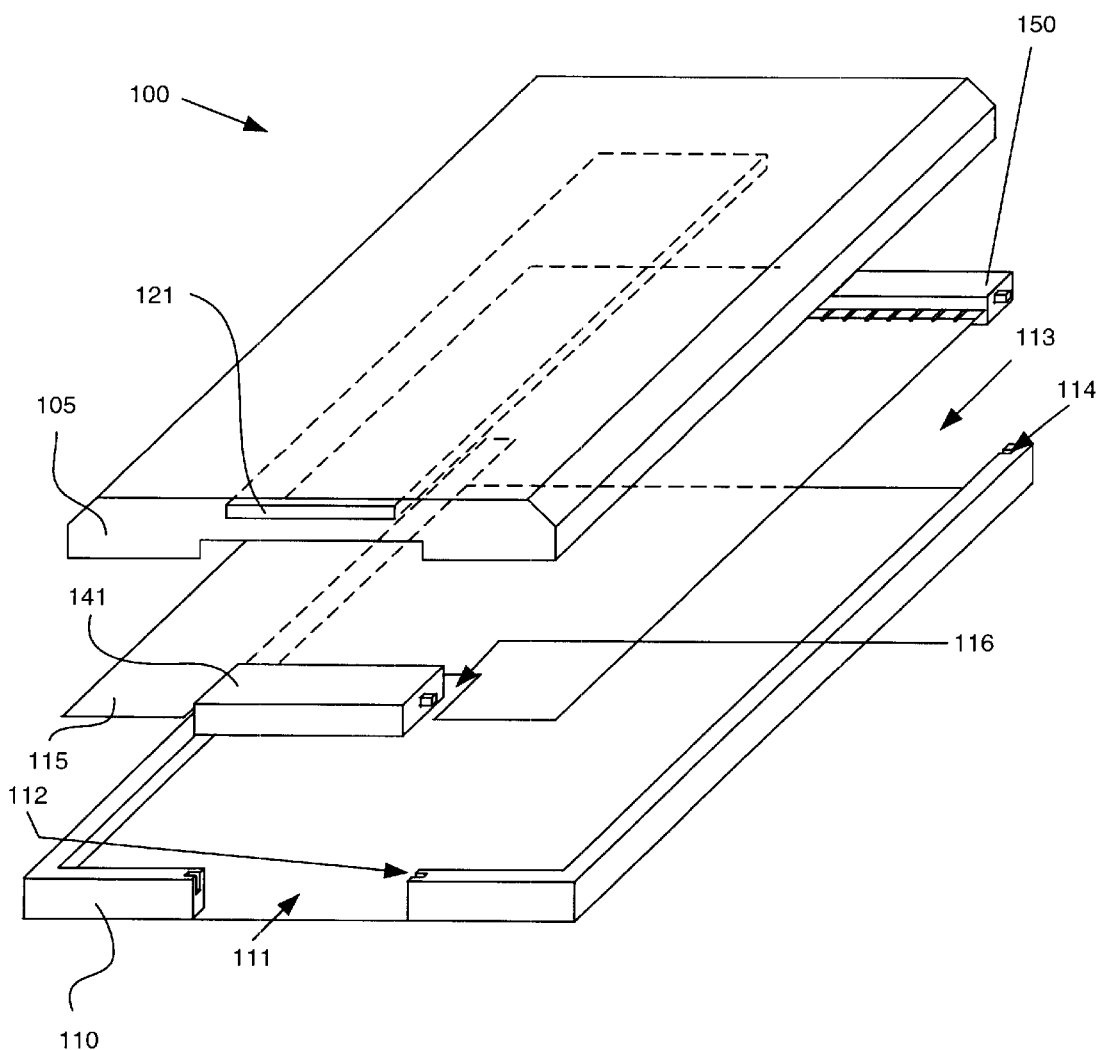
FIG. 18 is an abstract drawing representing an exploded view of the removable expansion card of FIG. 12, including the outer frame, inner PCB, and connectors.

FIG. 18 is an abstract drawing representing an exploded view of the removable expansion card 100 of FIG. 16, including the outer frame, inner PCB 115, and connectors. Visible for the first time in the view of FIG. 18, a second opening 113 is provided in the lower frame 110 for receiving the connector 150 for host interconnect. Additionally, a slot 112 is provided on both sides of the opening 111 to aid in the alignment and retention of the connector 141, and a slot 114 is provided on both sides of opening 113 to aid in the alignment and retention of the connector 150. An opening 116 is provided in the PCB for receiving the connector 141.

Figure 19:
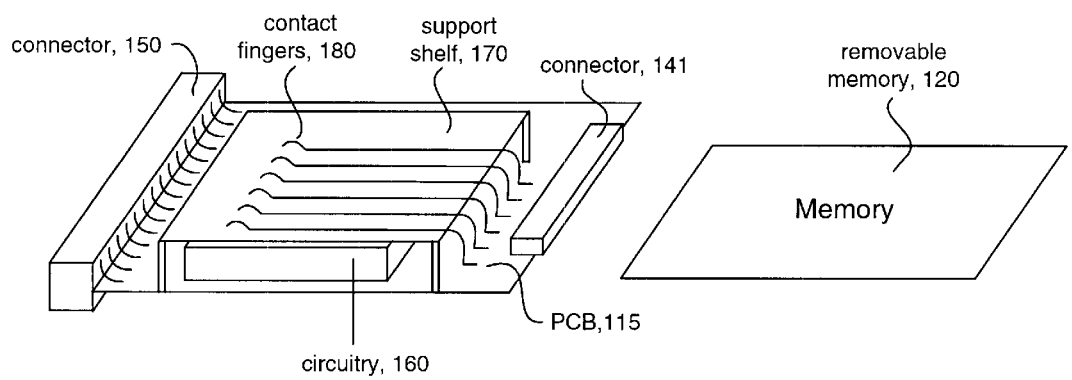
FIG. 19 is an abstract drawing representing a view of the removable expansion card of FIG. 12, with the outer frame removed, and a removable memory roughly aligned with the contact fingers to which it mates within the removable expansion card.

FIG. 19 is an abstract drawing representing a view of the removable expansion card 100 of FIG. 16, with the outer frame members removed, and a removable memory 120 roughly aligned with the contact fingers 180 to which it mates within the removable expansion card. Circuitry 160 is provided, including I/O adapter circuitry, removable memory adapter circuitry, and application-specific circuitry. A support shelf 170 supports, aligns, separates, and isolates the underside of the contact fingers 180 from the circuitry 160.

Figure 20:
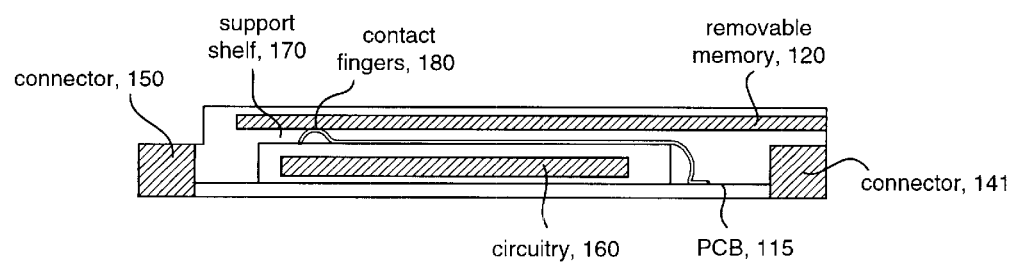
FIG. 20 is an abstract drawing representing a cut away side view of the removable expansion card of FIG. 12, with the removable memory inserted into the removable expansion card.

FIG. 20 is an abstract drawing representing a cut away side view of the removable expansion card 100 of FIG. 16, with the removable memory 120 inserted into the removable expansion card.

Figure 21:
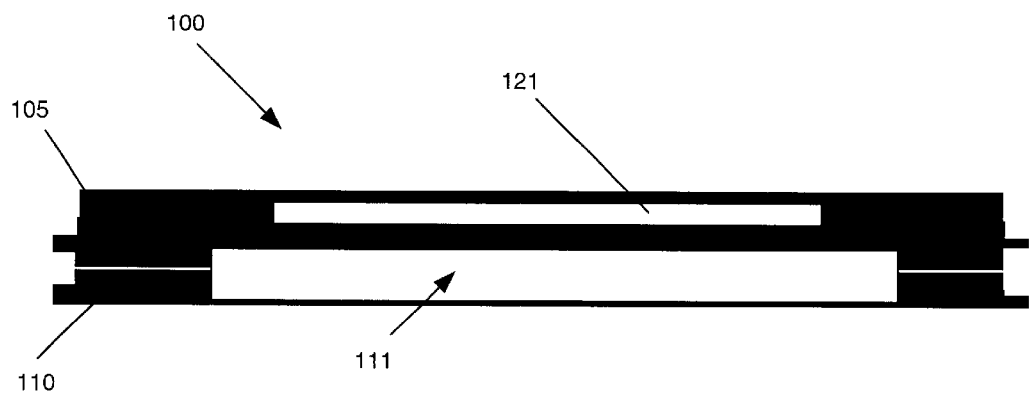
FIG. 21 is an abstract drawing representing an end view silhouette of the removable expansion card of FIG. 12.
Figure 22:
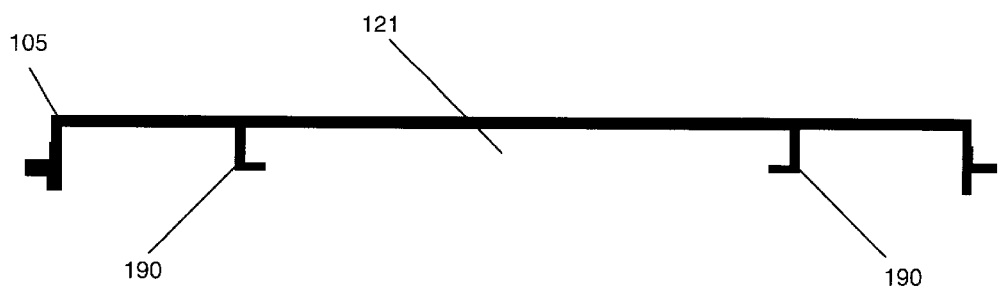
FIG. 22 is an abstract drawing representing a cross-sectional view silhouette of the upper frame member of the removable expansion card of FIG. 12.

FIG. 21 is an abstract drawing representing an end view silhouette of the removable expansion card 100 of FIG. 16. FIG. 22 is an abstract drawing representing a cross-sectional view silhouette of the upper frame member 105 of the removable expansion card 100 of FIG. 16. Guides 190 provide alignment and support for removable memory inserted via slot 121.

In an illustrative embodiment, the expansion card 100 and associated host connector 150 are compatible with the Type II CompactFlash Card as described in the previously referenced CompactFlash Specification. The I/O connector 141 is compatible with a PC-Card industry standard Honda-style 15-pin connector. The slot 121, removable memory 120, and removable memory adapter circuitry of circuitry 160, are compatible with the MultiMediaCard as described in the previously referenced MultiMediaCard System Summary.

Details of Component Assemblies and Stages of Assembly

Figure 23:
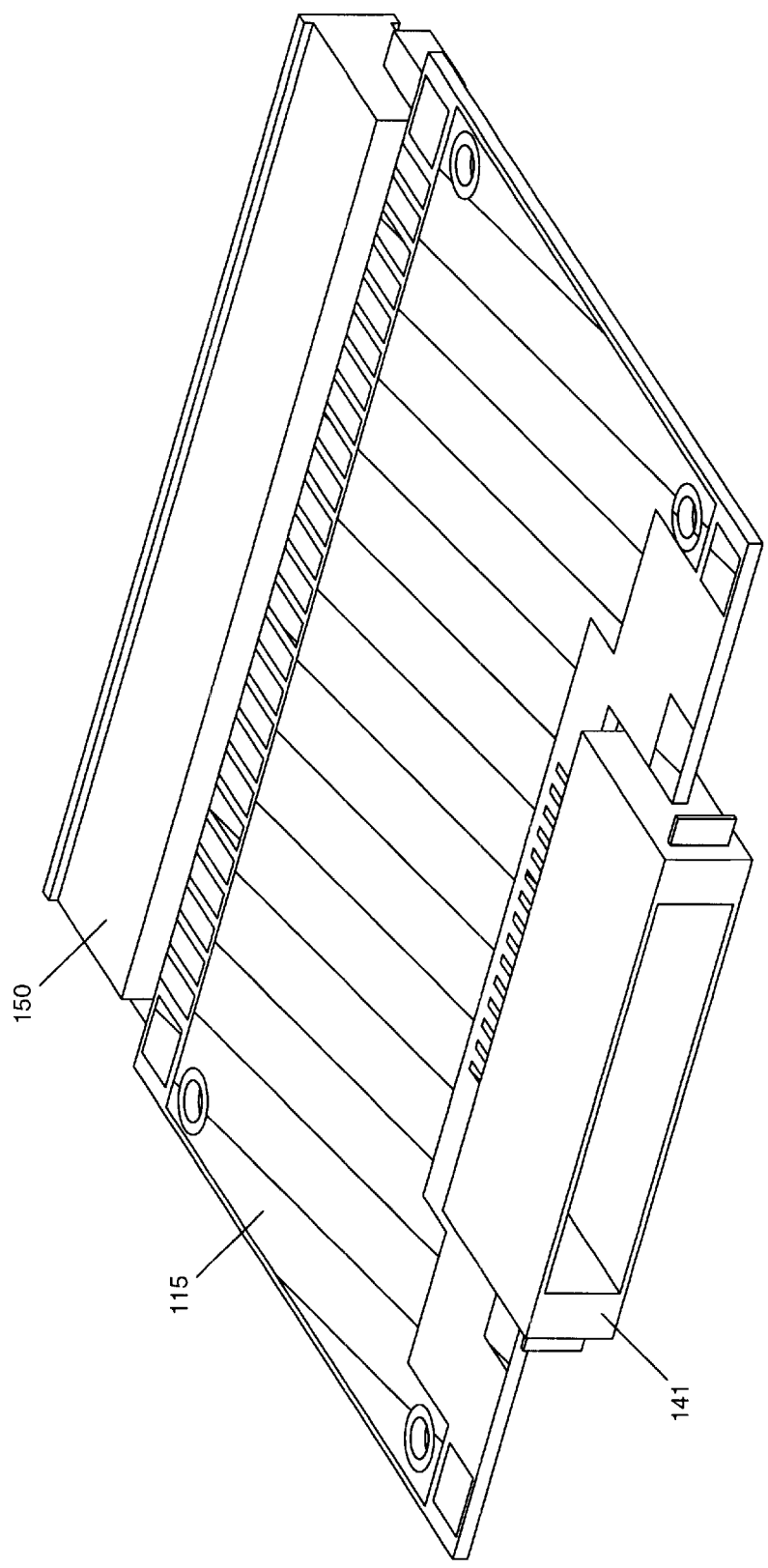
FIG. 23 is an axonometric projection of a prior art assembly that includes a Printed Circuit Board (PCB), a connector for mating with a PDA, and a connector for mating with external I/O.

FIG. 23 through FIG. 28 are axonometric projections showing the component assemblies for a CF Type II expansion card illustrative embodiment of the expansion module of FIG. 16 and in accordance with the present invention. FIG. 23 shows a prior art assembly that includes a Printed Circuit Board (PCB), an expansion bus connector (a CompactFlash bus connector is shown) for mating with a PDA, and a connector for mating with external I/O (a 15-pin Honda-style connector is shown). Note that while the general existence of holes in such PCBs and such PCB assemblies is prior art, and the assembly of FIG. 23 (and its later use in FIG. 29) is designated as such, as discussed below, the specific function and placement of the holes shown in the PCB of FIG. 23 is particular to the present invention, and is not found in the prior art.

Figure 24:
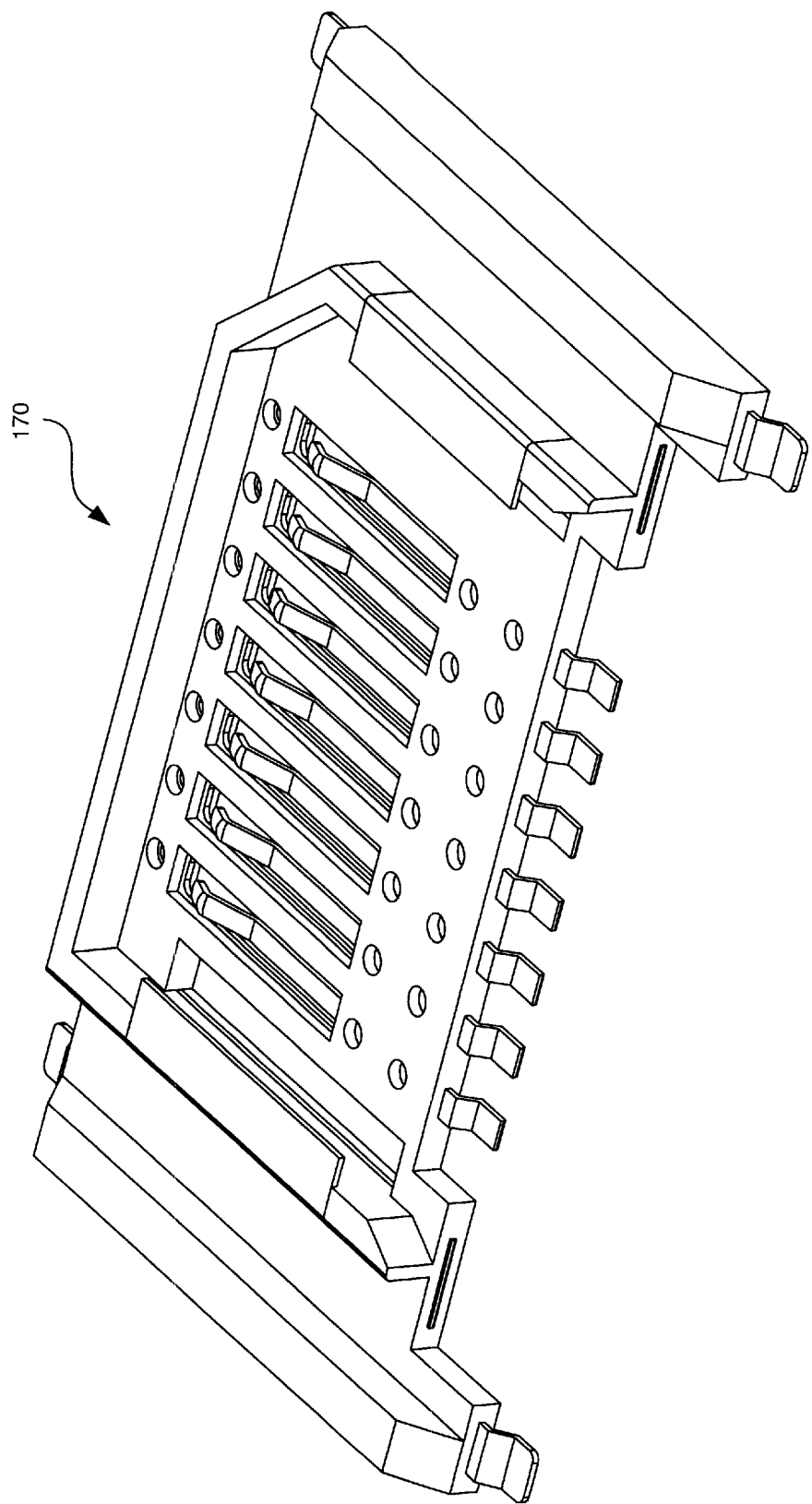
FIG. 24 is an axonometric projection of a contact finger assembly for making electrical connection with the second-level-removable expansion memory.

FIG. 24 shows a contact finger assembly for making electrical connection with the second-level-removable expansion memory. The underside of the contact finger assembly additionally has four alignment pins, two underneath the ends of each of the far side portions of the assembly. These pins and the assembly as a whole engage the PCB by way of matching alignment holes drilled in the PCB. Prior to mounting the contact finger assembly onto the PCB, a solder paste is applied to the PCB. The contact assembly and PCB will be ultimately reflow soldered, permanently attaching the contact assembly to the PCB.

The PCB acts as a chassis, supporting the expansion bus connector, the I/O connector, the contact finger assembly, and the application specific active circuitry of the expansion module. In the particular embodiment shown, due to space constraints on the topside of the PCB, the active circuitry is limited to the bottom side of the PCB. However, the use of other connectors and other contact finger assemblies will generally enable placement of active circuitry on the topside of the PCB.

Figure 25:
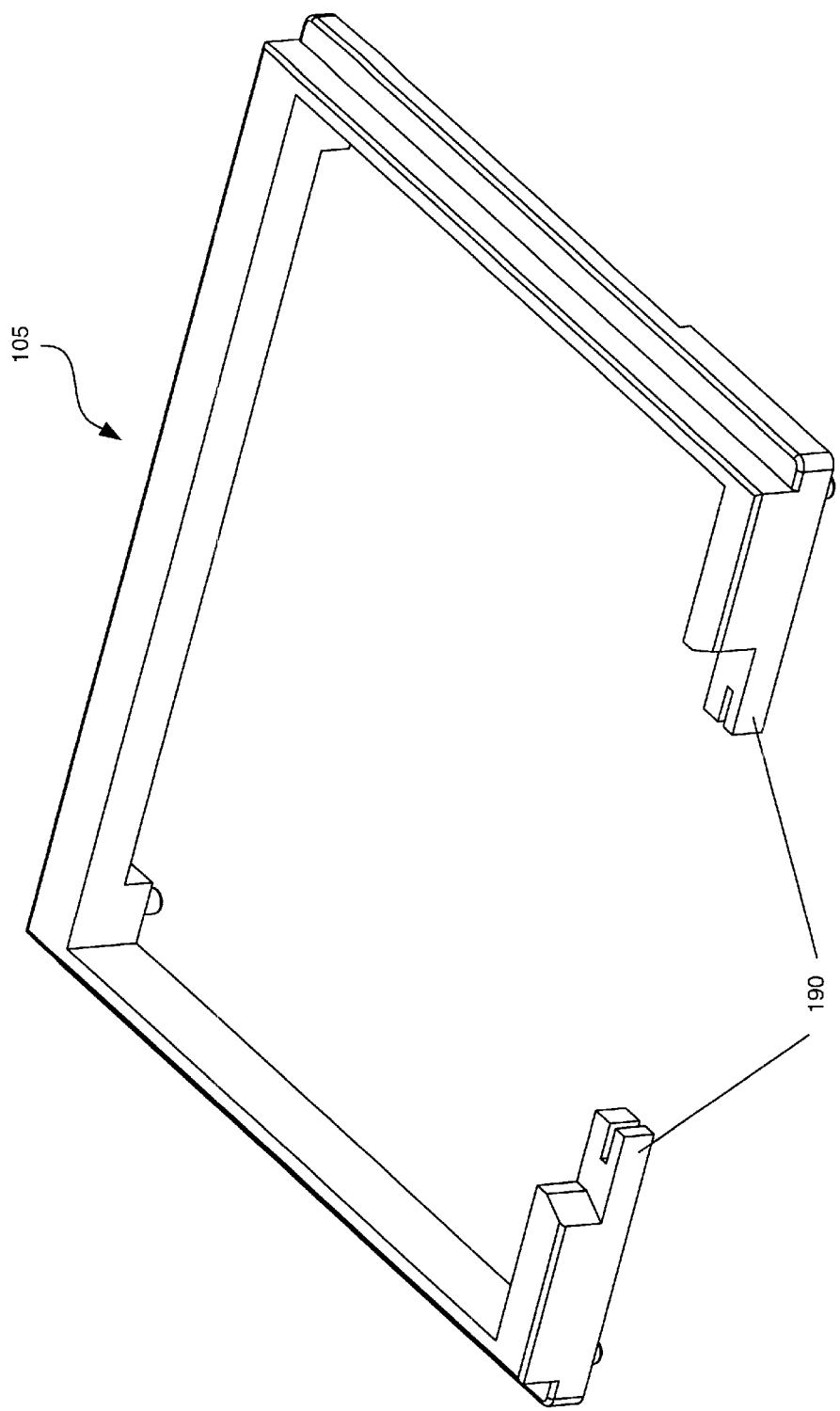
FIG. 25 is an axonometric projection of the upper section of a CF Type II frame in accordance with an illustrative embodiment.
Figure 26:
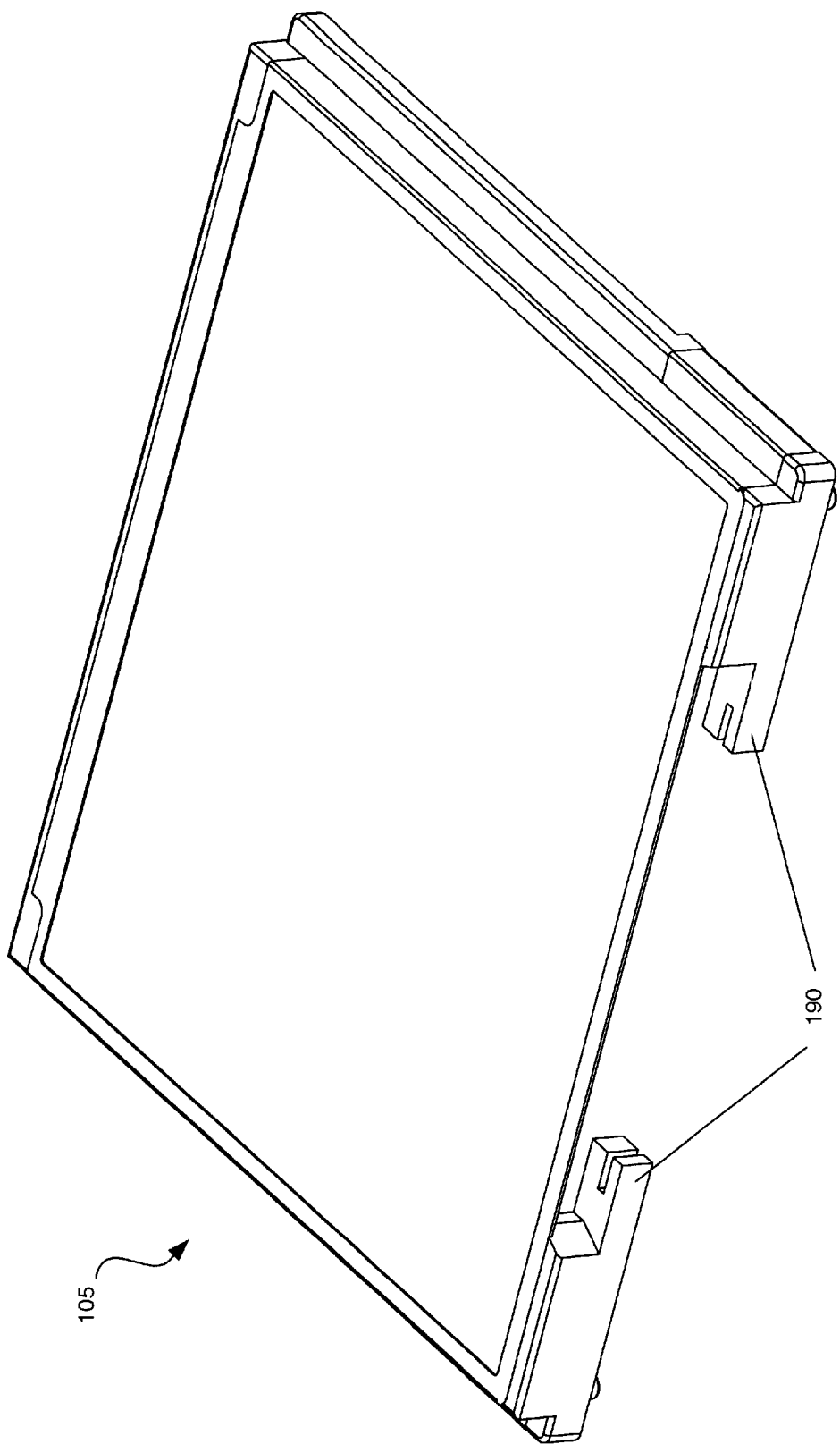
FIG. 26 is an axonometric projection of a CF Type II top case, comprising the upper section of the CF frame of FIG. 25 with a metal panel top, and in accordance with the present invention.
Figure 27:
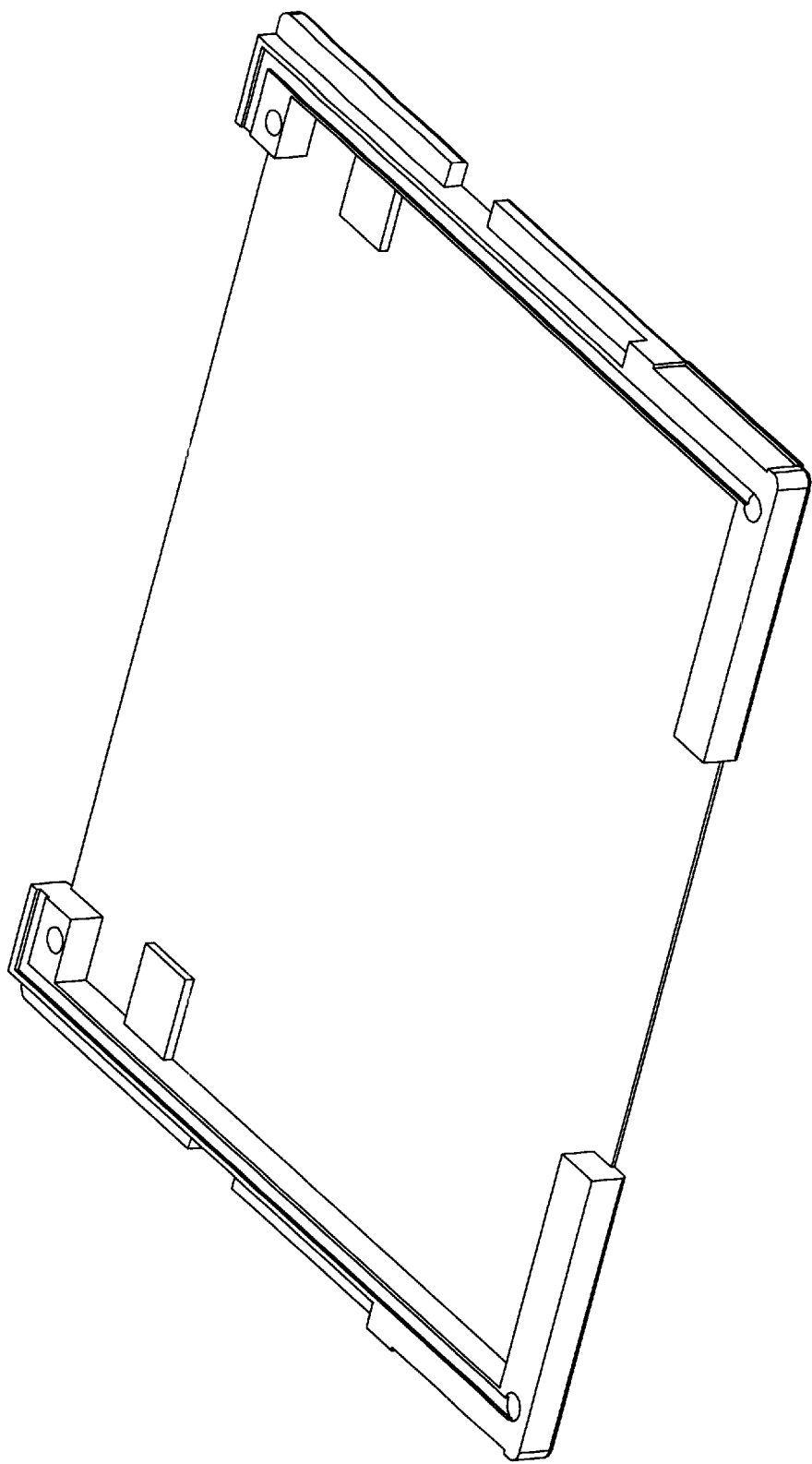
FIG. 27 is an axonometric projection of a prior art lower section of a CF Type II frame.

FIG. 25 illustrates the upper section 105 of a CF Type II frame in accordance with an illustrative embodiment. FIG. 26 diagrams a CF Type II top case, comprising the upper section of the CF frame of FIG. 25 with a metal panel top, and in accordance with the present invention. "Hooks" 190 are formed into the upper section, specifically to act (in conjunction with the metal panel top) as a slotted guide for insertion of the expansion memory. FIG. 27 shows a prior art lower section of a CF Type II frame. FIG. 28 illustrates a prior art CF Type II bottom case, comprising the lower section of FIG. 27 with a metal panel bottom.

Figure 29:
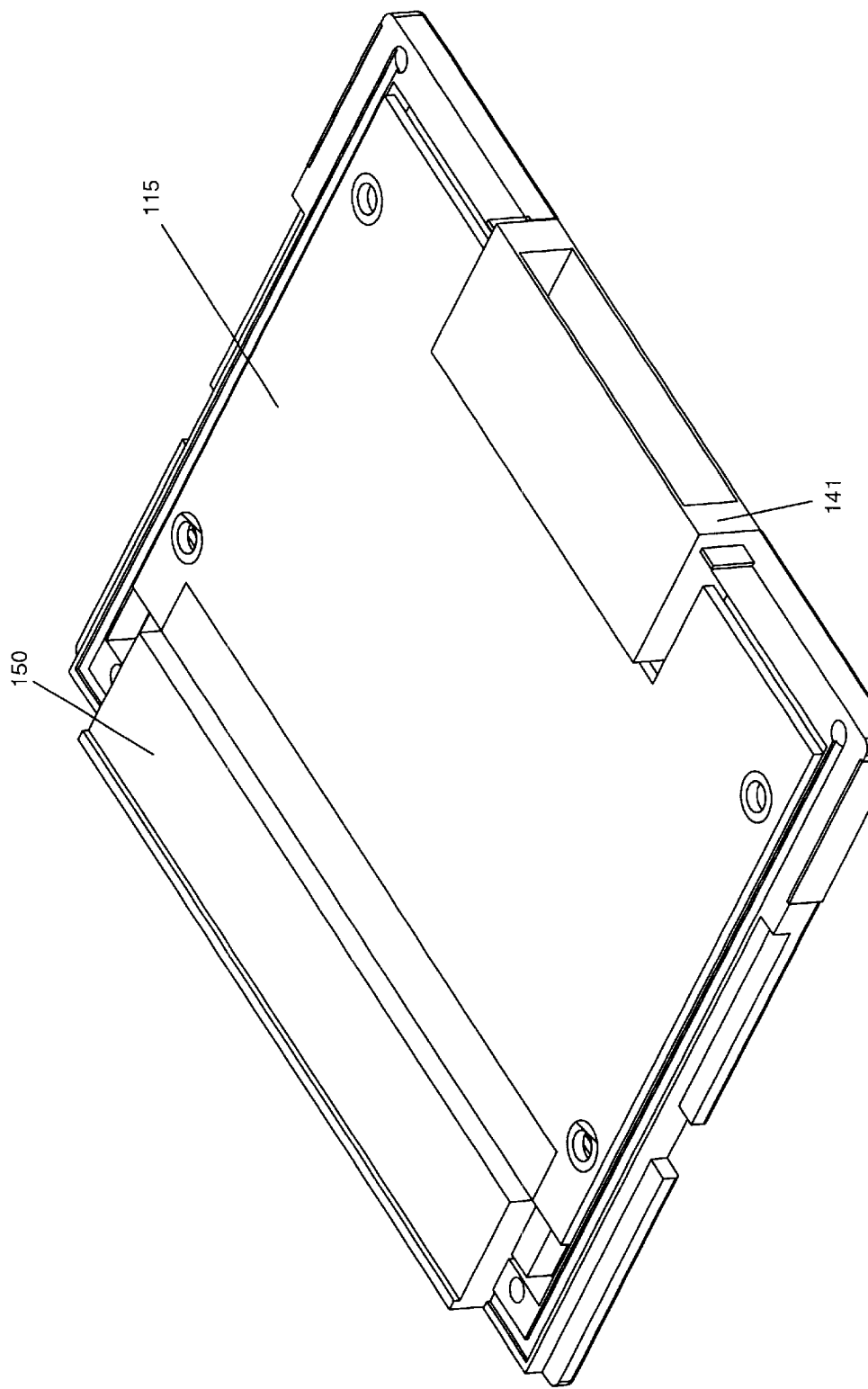
FIG. 29 is an axonometric projection of a prior art assembly that includes a CF Type II expansion card bottom case and the assembly of FIG. 23.
Figure 30:
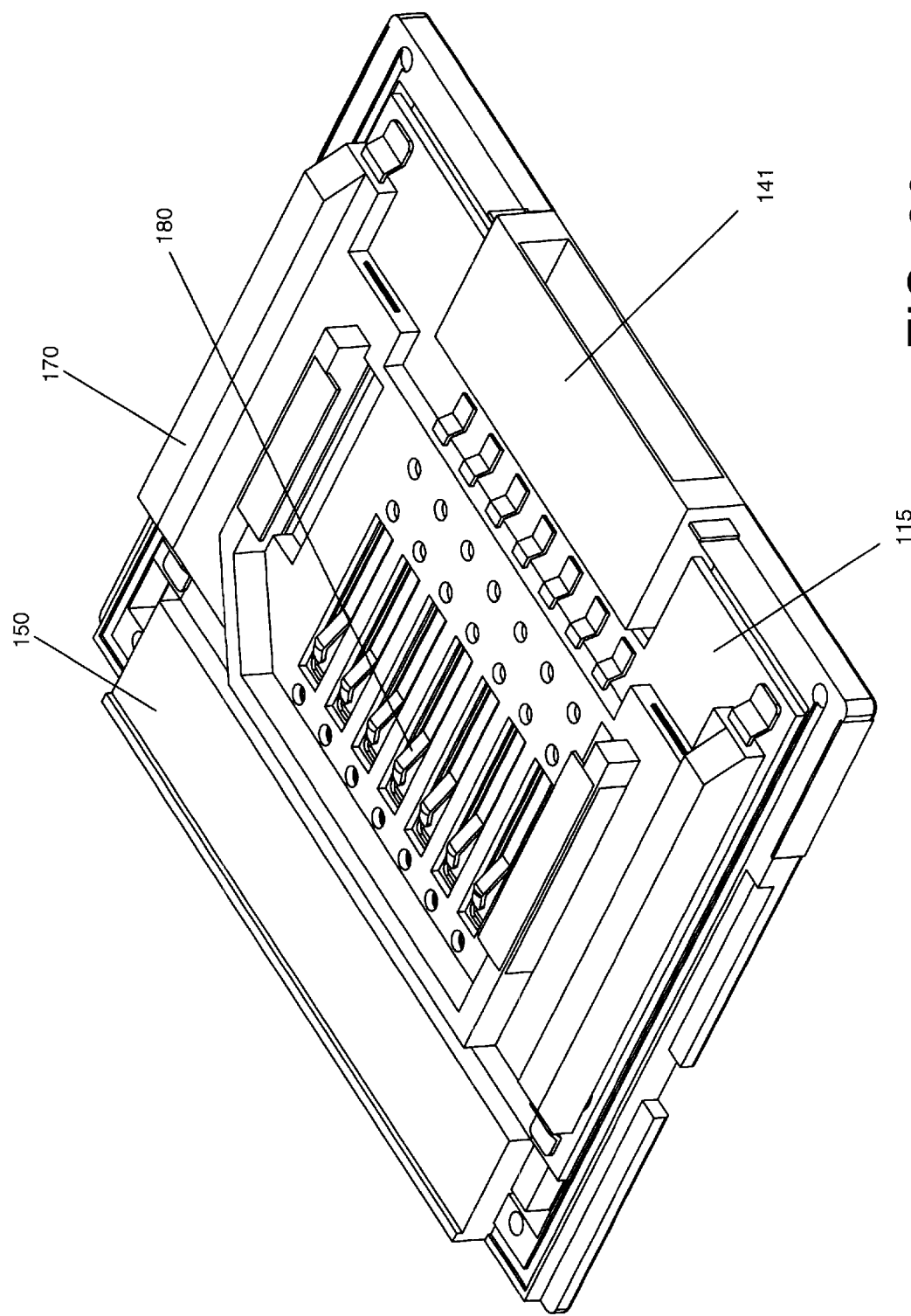
FIG. 30 is an axonometric projection of an assembly that includes the assembly of FIG. 29 with an MMC connector mounted on the Printed Circuit Board.
Figure 31:
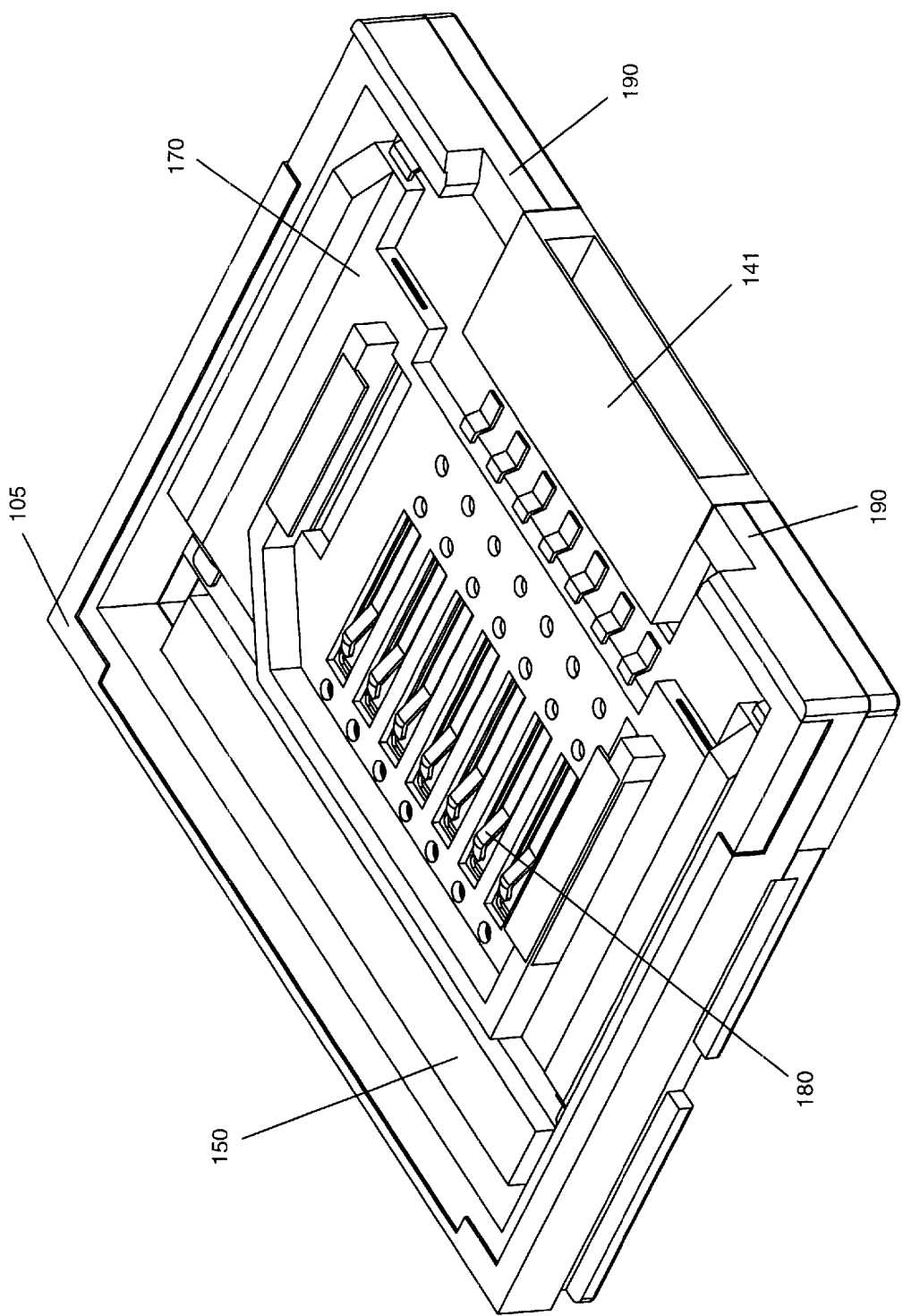
FIG. 31 is an axonometric projection of the assembly of FIG. 30 with a CF Type II expansion card top case without metal top.
Figure 32:
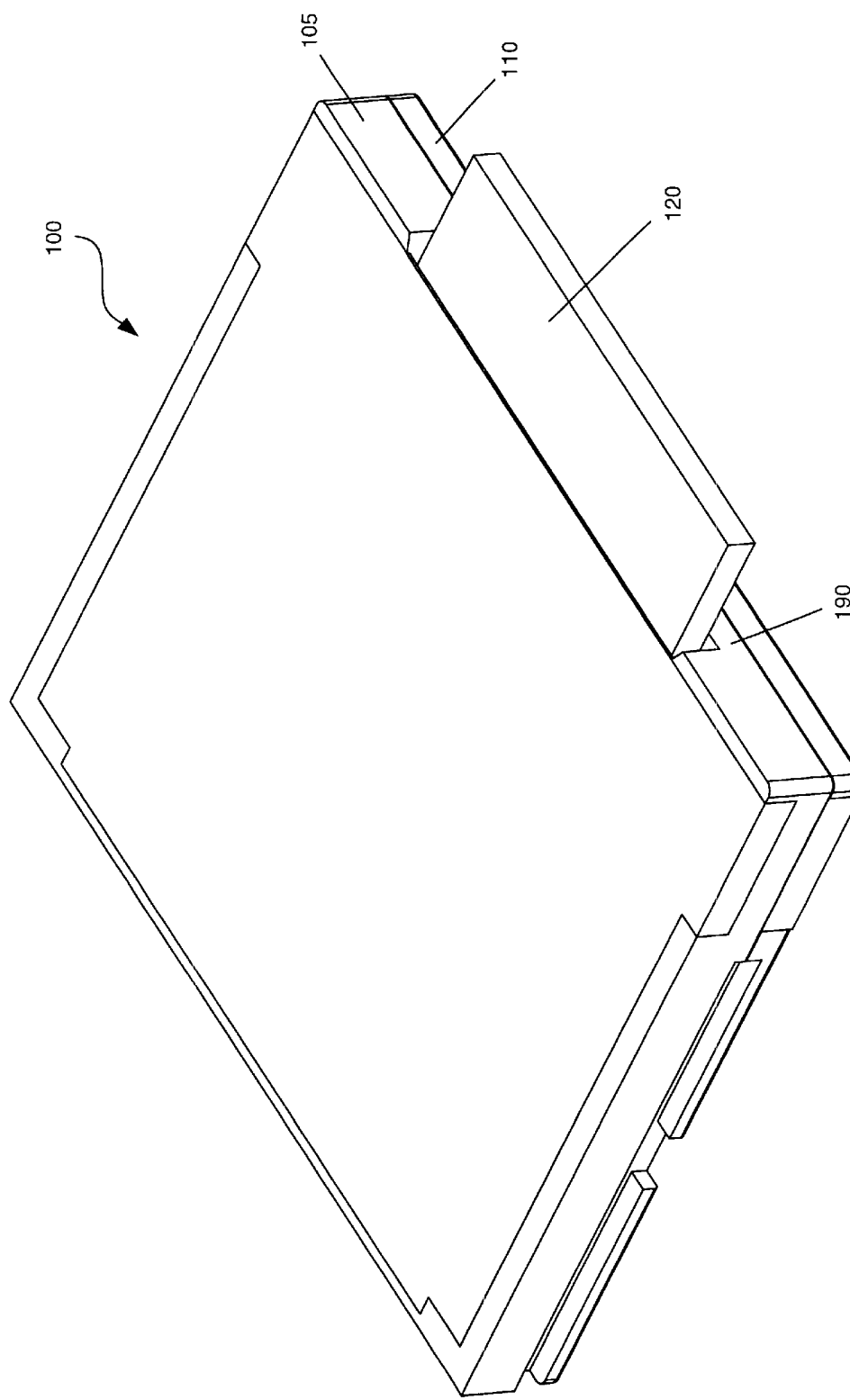
FIG. 32 is an axonometric projection of the assembly of FIG. 31 with a metal top, forming the complete CF Type II module, together with an inserted MMC.

FIG. 29 through FIG. 32 are axonometric projections showing the CF Type II expansion card in various stages of assembly using the component assemblies of FIG. 23 through FIG. 28. FIG. 29 illustrates a prior art assembly that includes a CF Type II expansion card bottom case (lower support frame with metal panel bottom) supporting the assembly of FIG. 23. FIG. 30 shows the contact finger assembly of FIG. 24 mounted and attached to the PCB chassis of FIG. 29. FIG. 31 adds a CF Type II expansion card top case, sans metal top, to the assembly of FIG. 30. FIG. 32 shows the completed CF Type II module, including the metal top, together with an inserted MMC.

Figure 37:
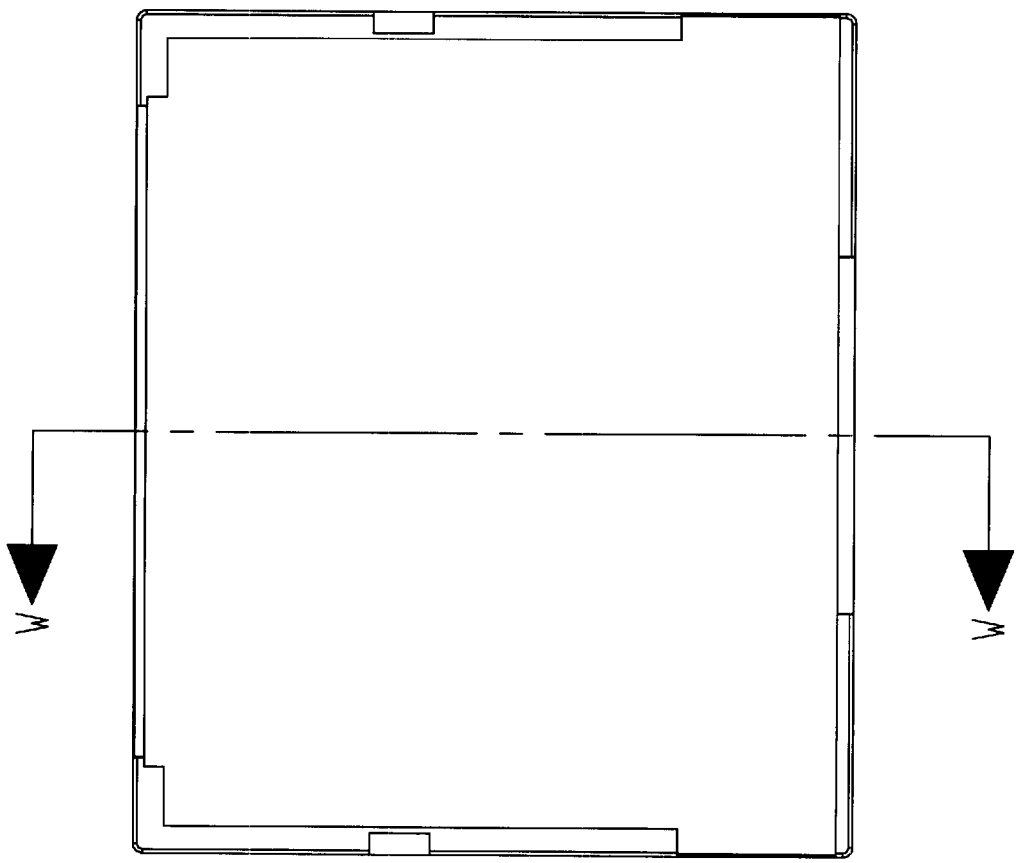
FIG. 37 identifies a cross-section plane (on the left) and shows the corresponding cross-section view (on the right) of the assembly of FIG. 32.

FIG. 33 through FIG. 36 are multiview orthographic projections of the assemblies in FIG. 29 through FIG. 32, respectively. FIG. 36 shows the completed CF Type II module, together with an inserted MMC. FIG. 37 identifies a cross-section plane (on the left) and shows the corresponding cross-section view (on the right) of the completed CF Type II module and inserted MMC of FIG. 32 and FIG. 36.

Top-Cavity Embodiment

Figure 38:
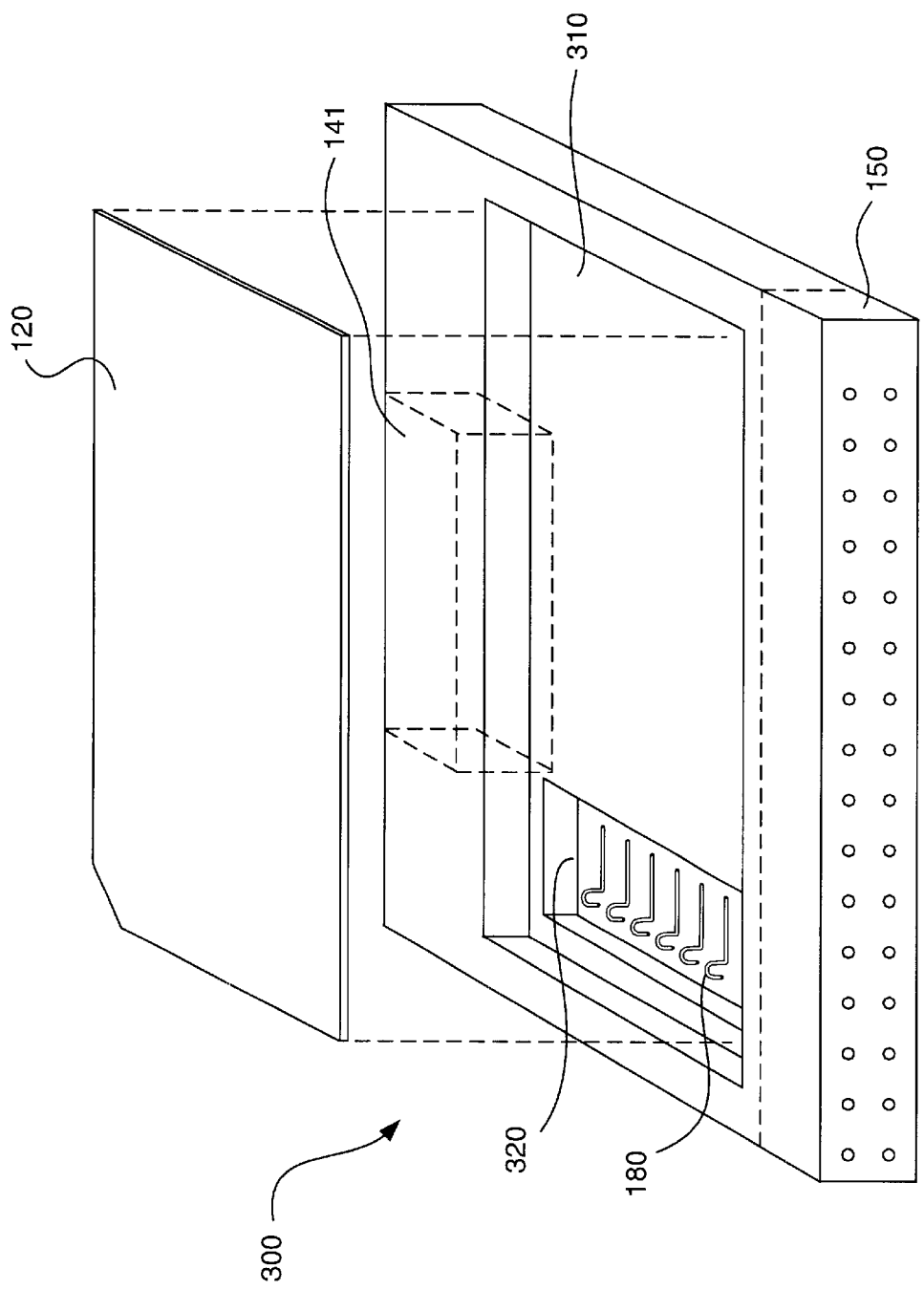
FIG. 38 shows an axonometric projection of an expansion card according to an alternate embodiment of the present invention that has an open recess for receiving an expansion memory.
Figure 39:
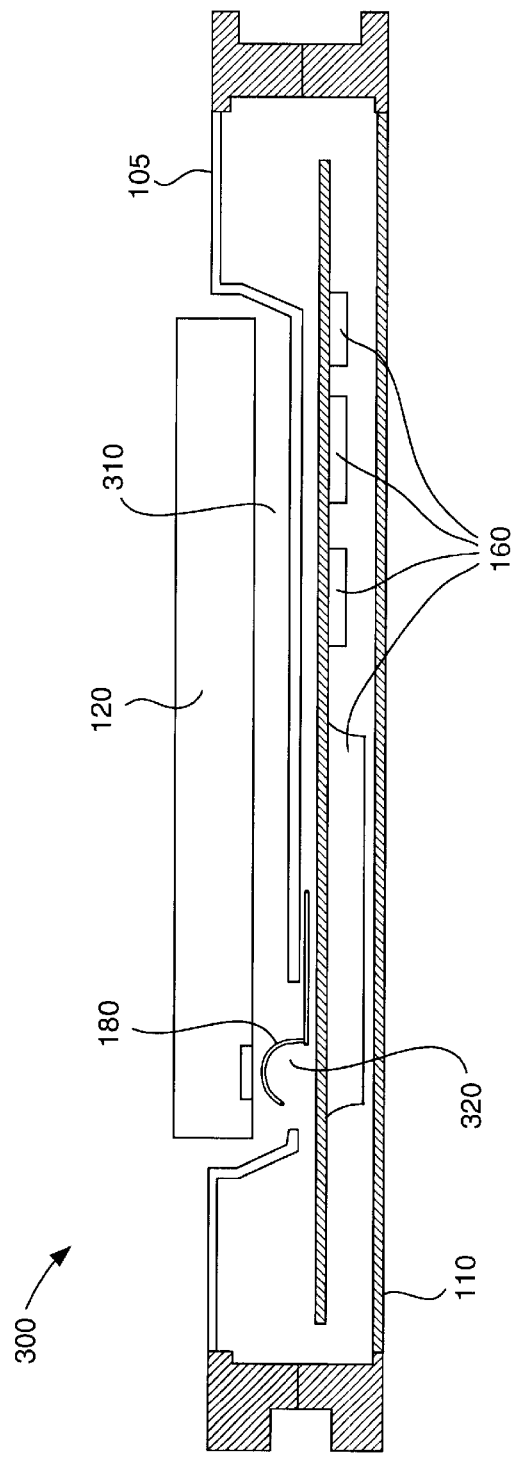
FIG. 39 is a cross section view of the expansion card of FIG. 38.

FIG. 38 shows an axonometric projection of an expansion module according to an alternate illustrative embodiment of the present invention. FIG. 39 is a cross section view of the expansion card of FIG. 38. The top case of this module has a cavity (an open recess) for receiving an expansion memory (an MMC in the illustration shown), the recess having the general shape of the expansion memory, but being slightly larger. The connector spring contacts for the memory emerge through the top of the case via one hole (a slot as shown), or a plurality of holes (slots) wherein each contact protrudes through a respective hole. In a preferred embodiment, the top-cavity expansion memory of FIG. 38 is implemented in the CF Type I form factor. The use of the CF Type I form factor for removable expansion modules having I/O and second-level removable memory is enabled by the use of the top-cavity and the general orientation shown for the expansion memory with respect to the I/O and expansion bus connectors (a 90-degree rotation compared to the non-top-cavity embodiments).

Persons skilled in the art will recognize that such top-cavity modules may be readily implemented in either the closed-back or open-back industrial design approaches by appropriately varying the rail configuration of the package frame in accordance with the desired expansion module standard.

The expansion memory is deposited into the receiving cavity, the top of the expansion memory being roughly flush to slightly above the outer perimeter of the top case. When the module is inserted into a compatible slot of a host device, the expansion memory is locked into the receiving cavity by the presence of the adjacent wall (or roof) of the slot. The connector spring contacts of the expansion module are depressed by the presence of the expansion memory, thus effecting the mating (electrical continuity) of these contacts with the contacts of the expansion memory.

Figure 40:
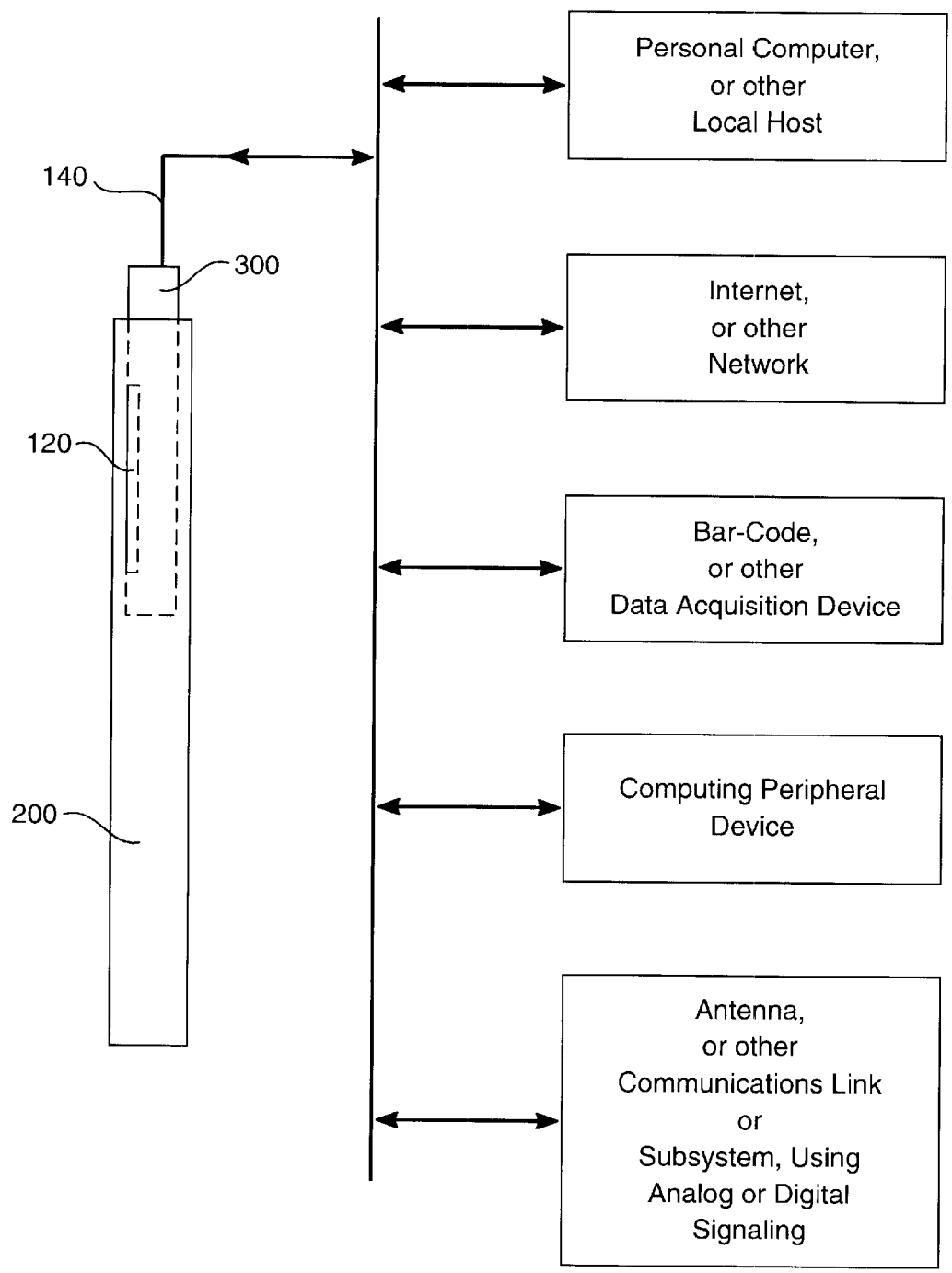
FIG. 40 illustrates a PDA having a closed-back industrial design, equipped with a top-cavity expansion module, and coupled to various types of I/O, in accordance with the present invention.
Figure 41:
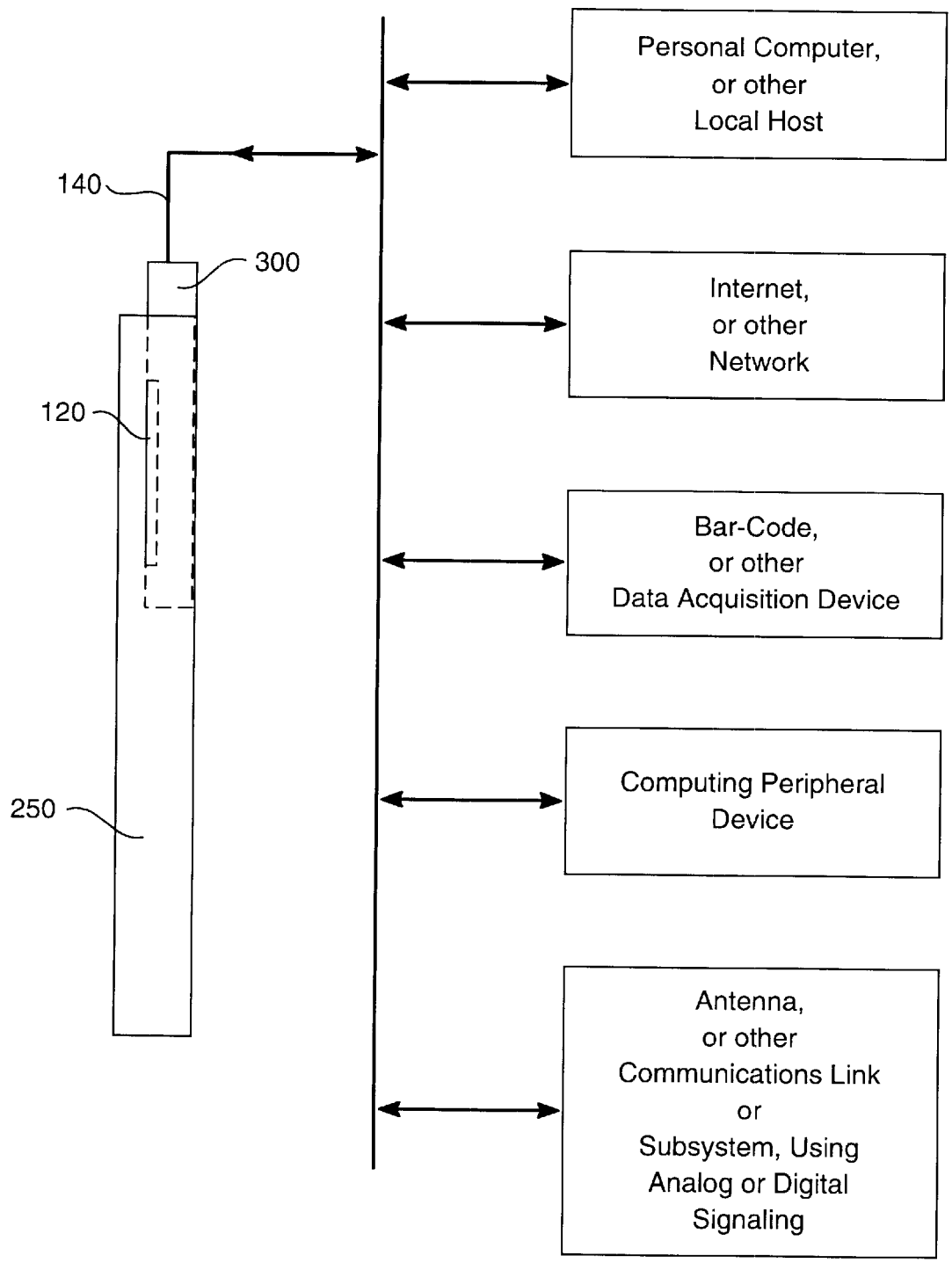
FIG. 41 illustrates a PDA having a open-back industrial design, equipped with a top-cavity expansion module, and coupled to various types of I/O, in accordance with the present invention.

The top-cavity expansion module of FIG. 38 and FIG. 39 also has an I/O connector that is accessible for I/O functions, including any those described herein. FIG. 40 illustrates a PDA having a closed-back industrial design, equipped with a top-cavity expansion module, and coupled to various types of I/O, in accordance with the present invention. FIG. 41 illustrates a PDA having a open-back industrial design, equipped with a top-cavity expansion module, and coupled to various types of I/O, in accordance with the present invention.

Circuitry and Functionality of the Expansion Module

In an illustrative embodiment of the invention, circuitry 160 includes I/O adapter circuitry and removable memory adapter circuitry. The I/O adapter functionality may include one or more of, but is not limited to, Ethernet, serial port, audio, telephone, antenna, and special-function interfaces such as bar code and other scanners. The removable memory adapter functionality may include one or more of, but is not limited to, main memory expansion, mass-media emulation, and other host-based special-purpose memory applications.

In accordance with an illustrative embodiment, circuitry 160 further includes application-specific circuitry for which the management of the removable memory is an ancillary function to the primary function of the specific application. Specific examples of such application-specific expansion cards having both I/O and removable memory are provided in later sections.

Figure 1:
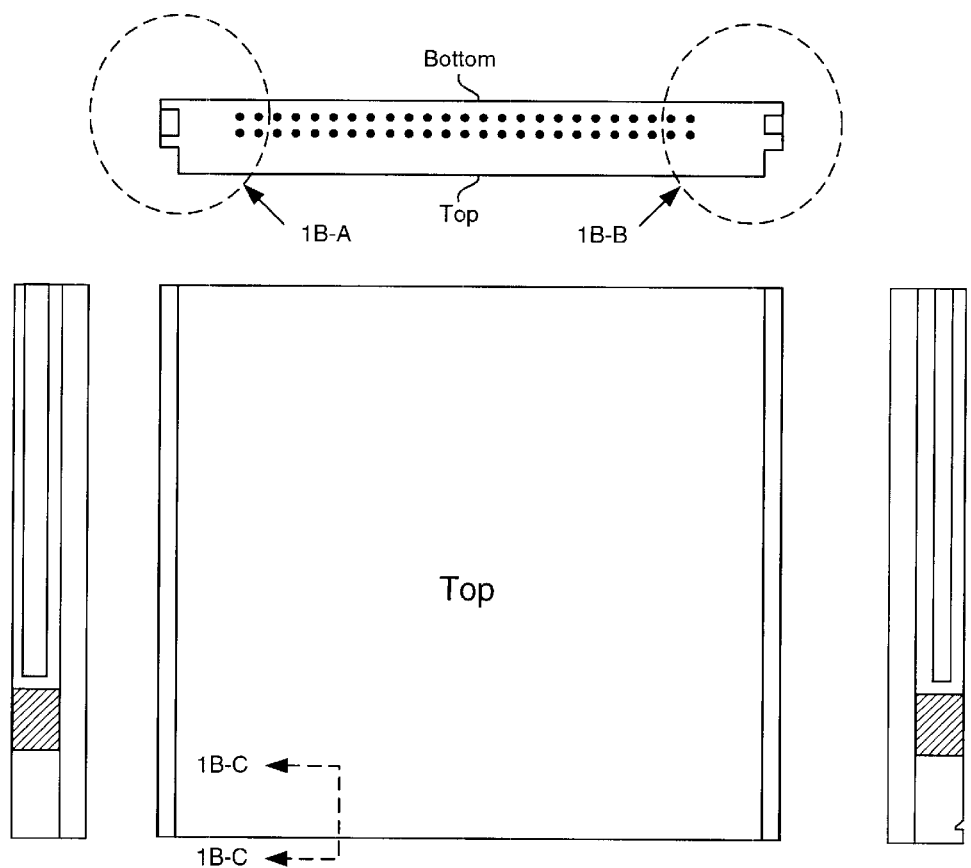
FIGS. 1, 2, and 3 are different views of a prior art Type II CompactFlash card.
Figure 2:
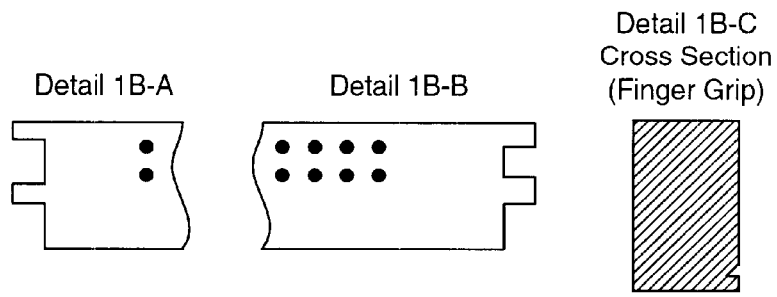
Figure 3:
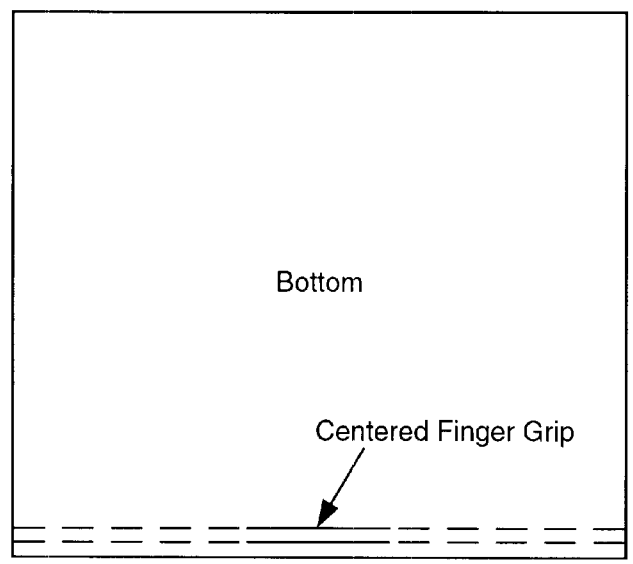
Figures 4, 5:
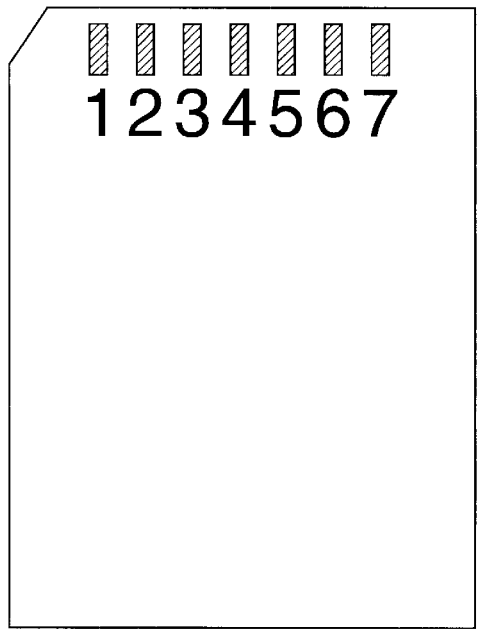
FIGS. 4 and 5 represent a prior art MultiMediaCard form factor and its pad definitions.
Figure 8:
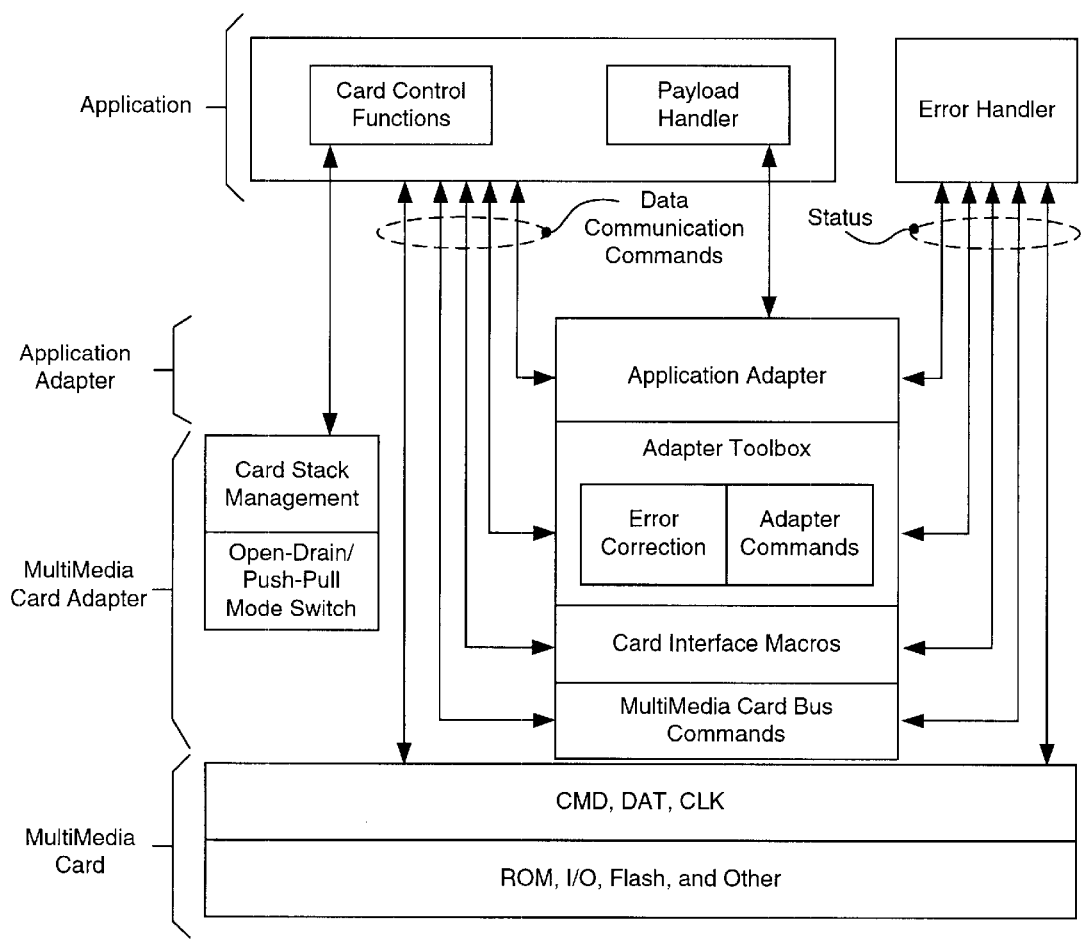
FIG. 8 illustrates the prior art functional partitioning of a generic MultiMediaCard system.
Figure 9:
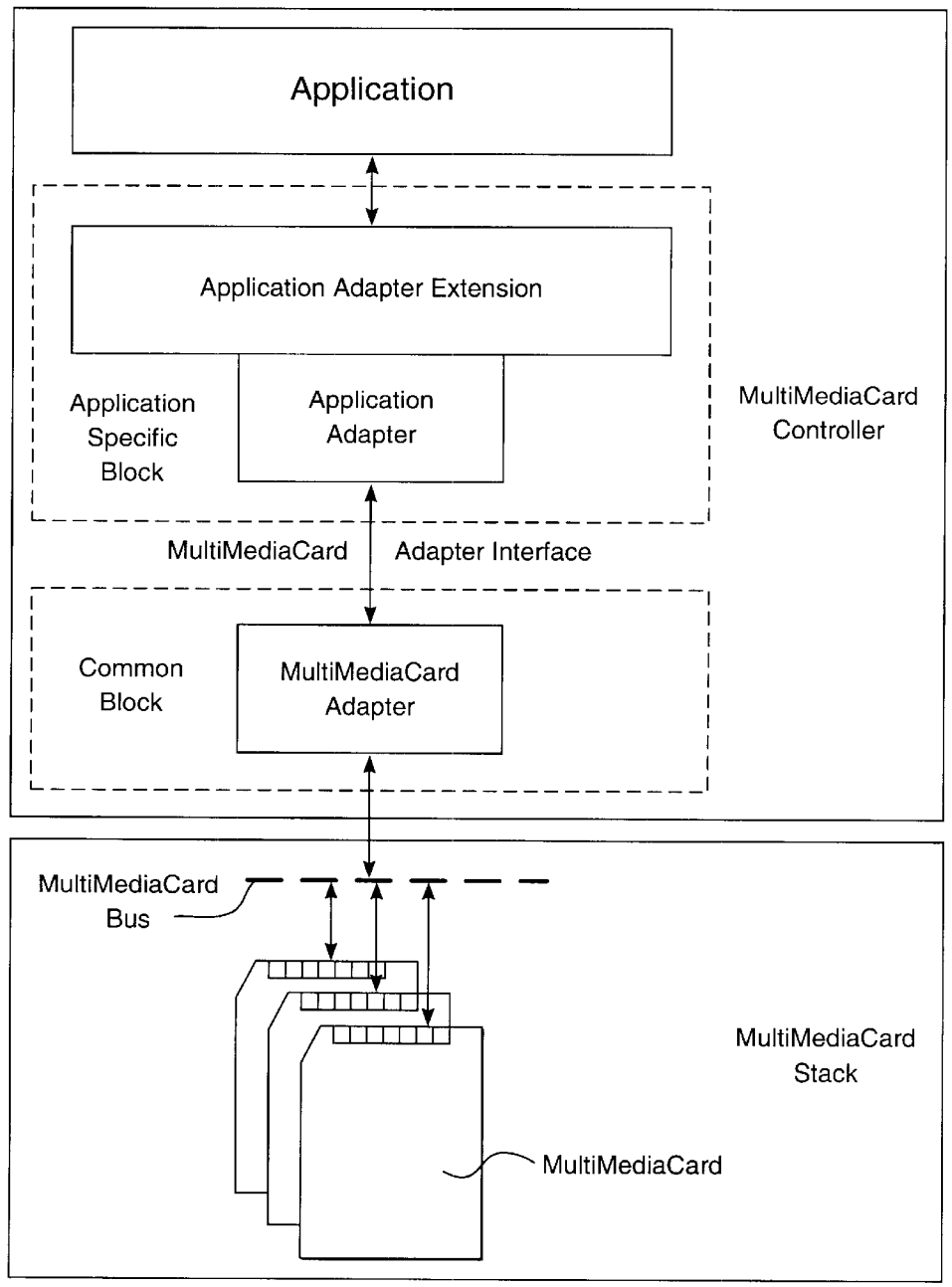
FIG. 9 illustrates the prior art physical partitioning of a generic MultiMediaCard system.
Figure 11:
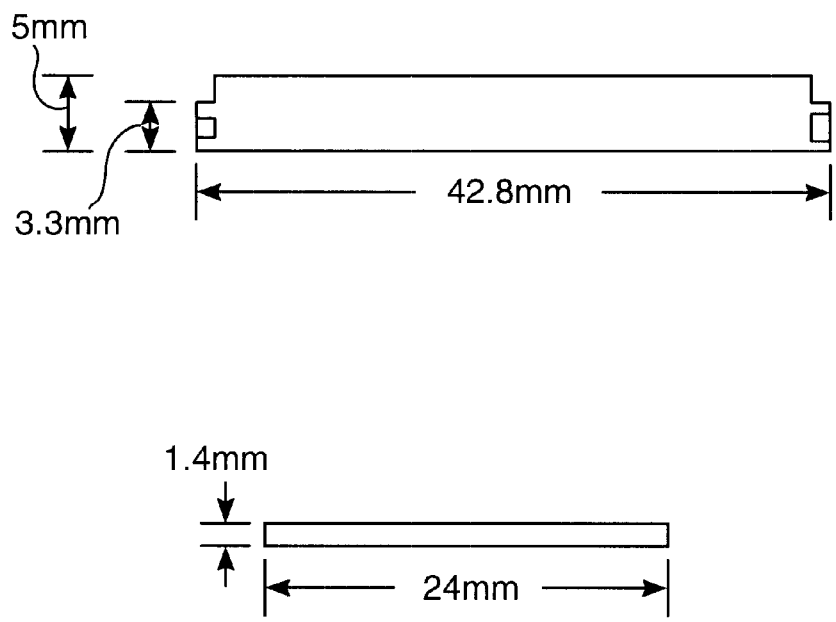

In preferred implementations of the illustrative embodiments mentioned above, the functions performed by the removable memory are those of a MultiMediaCard adapter as illustrated in the MultiMediaCard adapter section of the MultiMediaCard system architecture diagram of FIG. 8. If the removable memory is being used to provide host-base memory expansion, such as described for the first embodiment, then the host must provide the functionality illustrated by the Application and Application Adapter sections of FIG. 8. If the removable memory is being used at least sometimes as an ancillary memory (at least sometimes private) to the application-specific circuitry contained on the expansion card, such as for the second embodiment, then the application-specific circuitry must provide the Application and Application Adapter section functionality, or else the application-specific circuitry must call on host services for such functionality.

Examples of known techniques for making and using other types of memory adapter circuitry for closed-case expansion cards or with flash memory are found in the previously referenced '145, '426, '584, '774, and '108 patents, among others. Examples of known techniques for making and using I/O adapter and application-specific circuitry for functions implemented in closed-case expansion cards and with flash memory are found in the previously referenced '374, '577, '774, and '108 patents, among others.

Frame Kit Assembly Details

The top and bottom frames may be composed of metal or plastic. In a preferred embodiment, the top and bottom frame portions each have a plastic base augmented with an outer metal plate over much of the interior region of the large panel surface of each portion. The metal plate extends to the edges of the panel at the connector ends of each portion and is attached to both connectors. In addition, smaller metal strips, or ears, on both sides at the finger-grip end (opposite to the host connector) extend from the plate to the edges of the panel and continue onto the sides. The frame kit is assembled and the side strips are sonically welded together on both sides of the casings. The welded strips and plates form a single continuous metal band around the top and bottom frames that permanently physically retains the assembled kit.

I/O Interconnect Options

I/O devices may be interconnected with the expansion card via three different embodiments. First, a PC-Card industrystandard Honda-style 15-pin connector may be used with a mating detachable cable. Detachable cables are preferred for light-duty applications where a continuous I/O device connection is neither needed nor desired. Second, a fully integrated fixed cable, having a molded strain relief may be used. Such a fixed cable maintains solid contact in high vibration environments, is protected against lateral stress, and seals out dust. Fixed cables are preferred for dedicated industrial or field applications. Third, at least a portion of the I/O device may be abutted and attached (often via a snap-in-place mechanism) directly to the expansion card, obviating the need for either a detachable or fixed cable. Cableless snap-on I/O devices are preferred for small mostly self-contained I/O devices that permit a compact PDA, expansion-card, I/O-device combination that handles physically as a single piece of equipment. In the instant invention, such snap-on I/O devices must make allowance for the removable memory.

PDA having Application Specific Card with Removable Media

Figure 12:
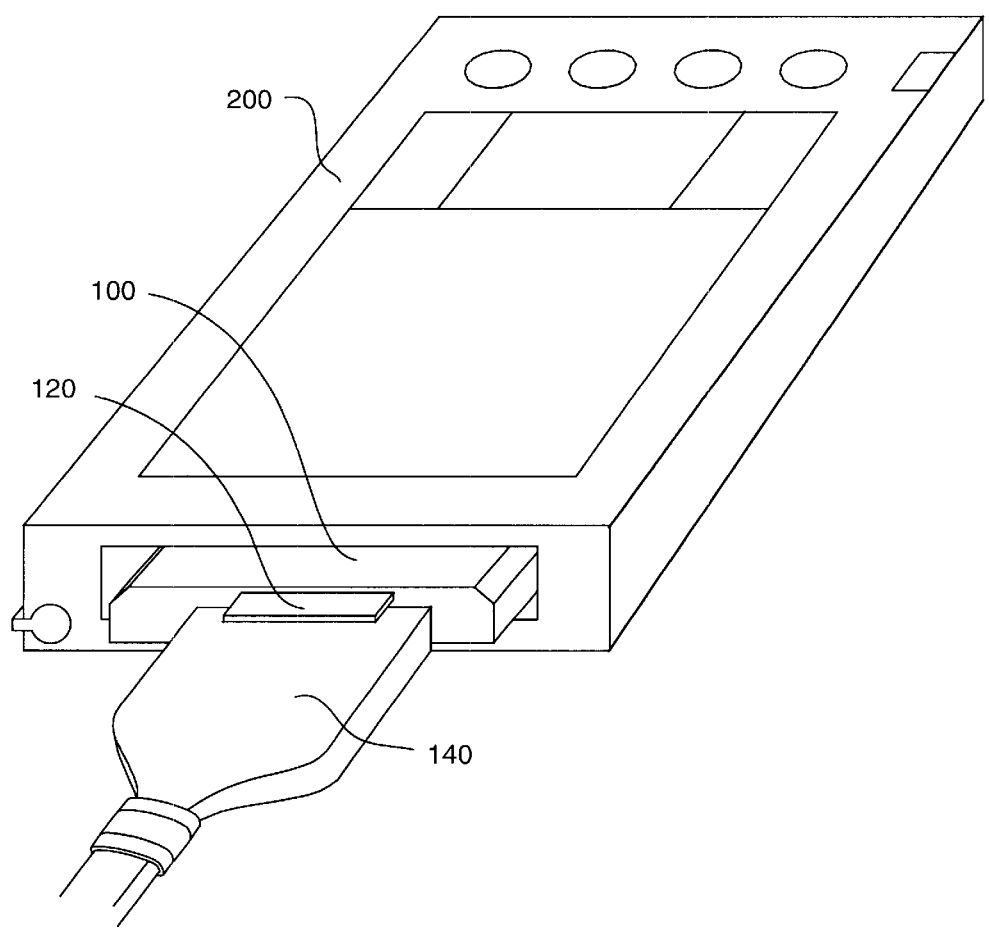
FIG. 12 illustrates a PDA equipped with a removable expansion card having both I/O and removable memory in accordance with the present invention.
Figure 13:
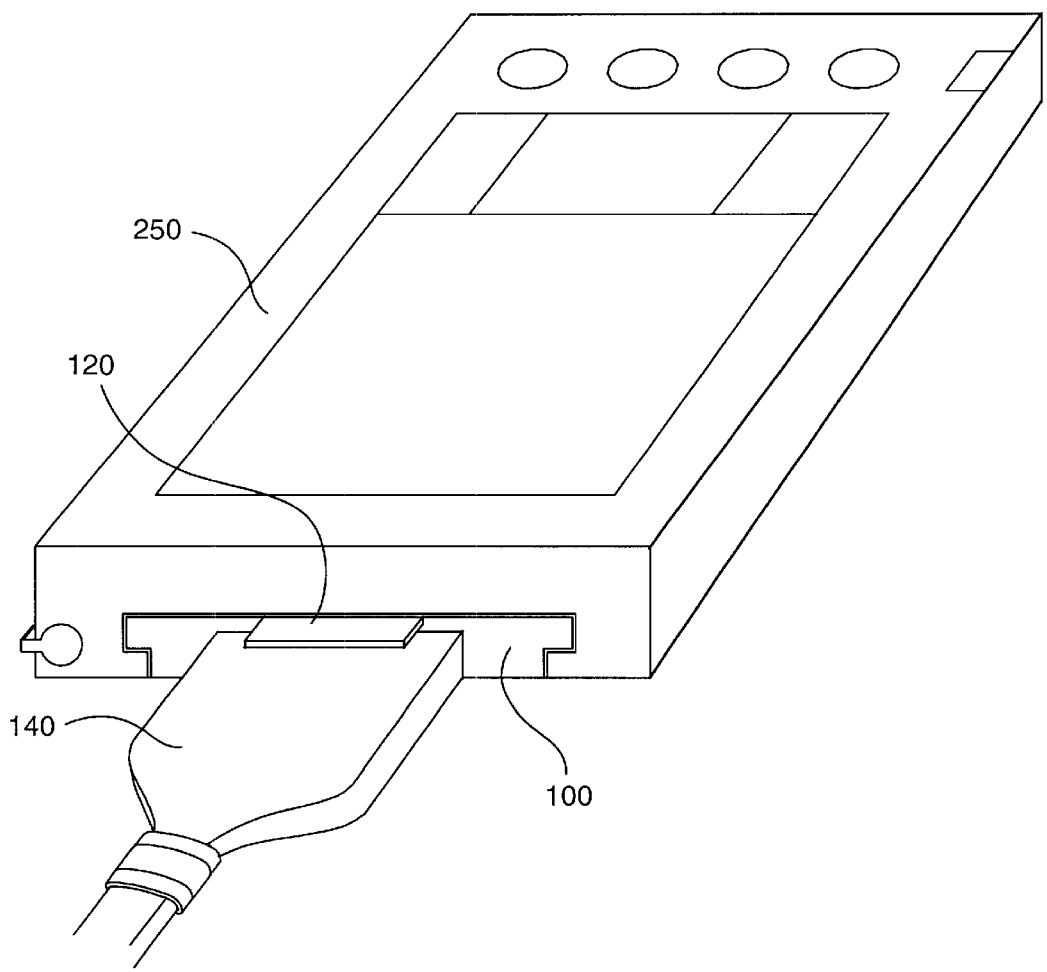
FIG. 13 illustrates a PDA equipped with a removable openface expansion card having both I/O and removable memory in accordance with the present invention.

FIG. 12 illustrates a PDA 200 equipped with a removable expansion card 100 having both I/O interconnect 140 and removable memory 120 in accordance with the present invention.

Figure 14:
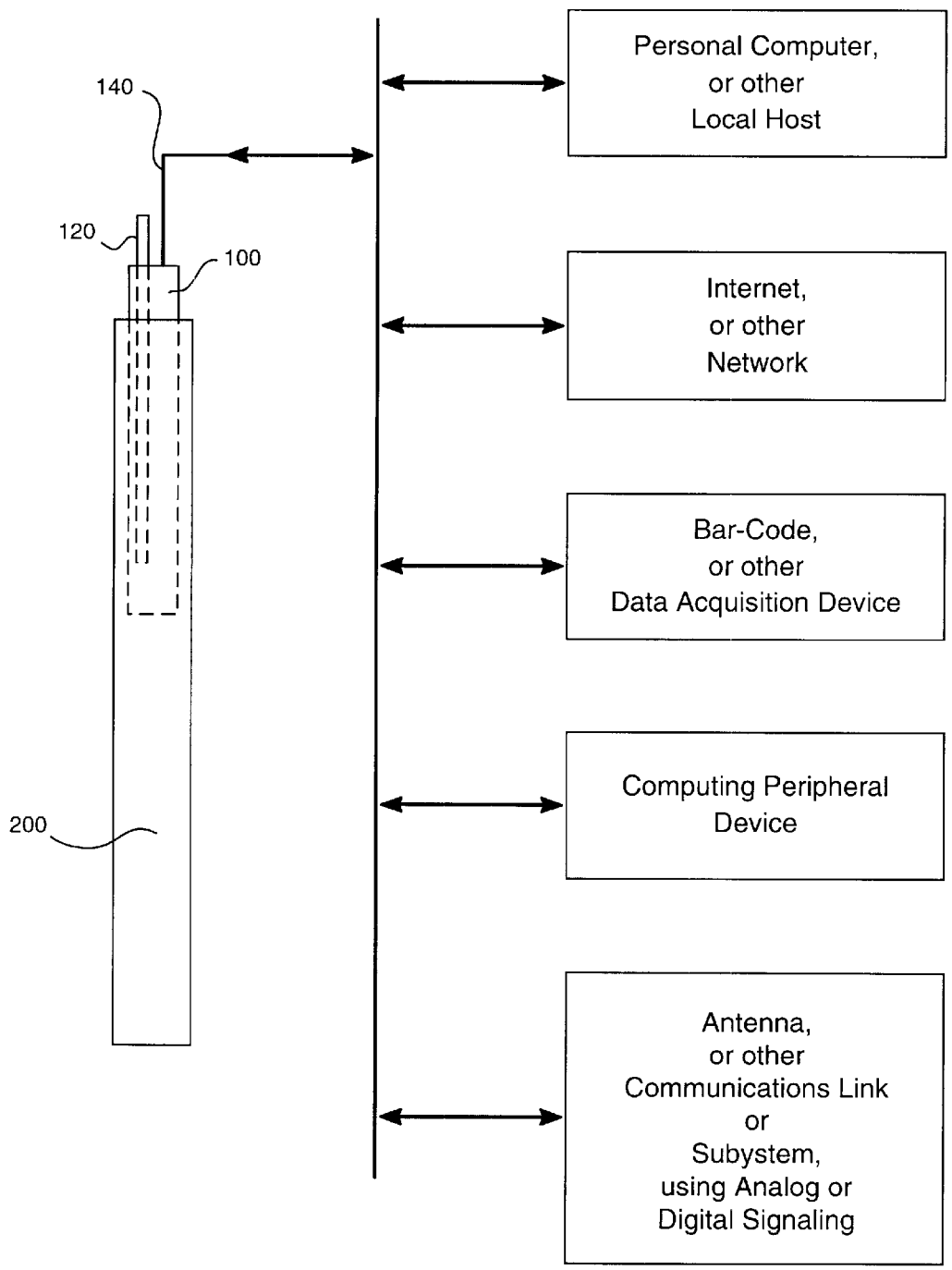
FIG. 14 illustrates some of the various types of I/O for which the PDA and removable expansion card of FIG. 12 may be equipped.
Figure 15:
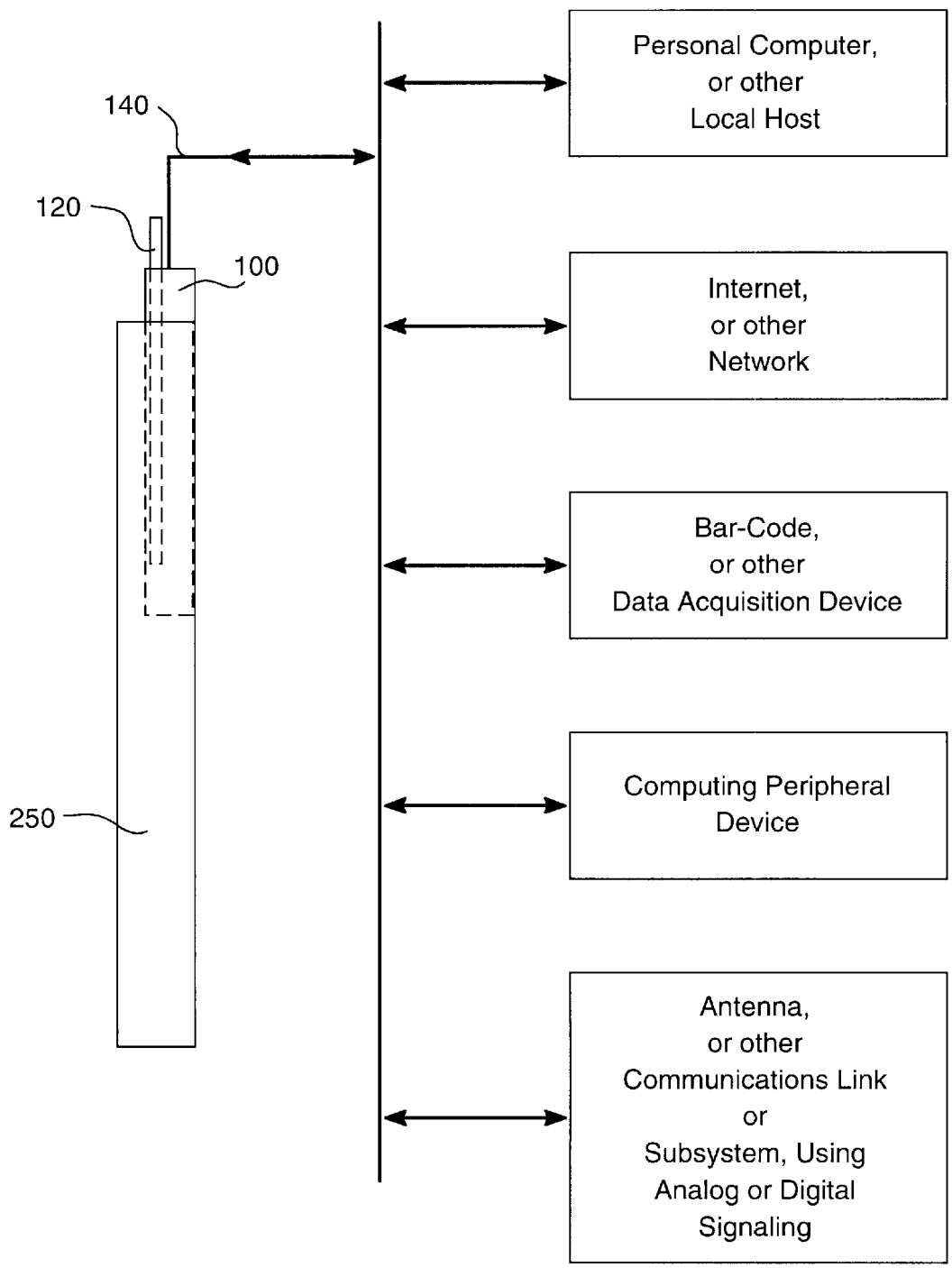
FIG. 15 illustrates some of the various types of I/O for which the PDA and removable open-face expansion card of FIG. 13 may be equipped.

The application specific circuitry of the expansion card may be used in conjunction with application specific software running on the PDA. This permits the application specific circuitry of the expansion card to make use of the output (e.g., display, sound) and input (e.g., tablet, buttons, any I/O ports) capabilities of the PDA for user interface functions associated with the specific application. In particular the PDA's display/input-tablet provides for virtual controls and visual indicators for the application. FIG. 14 illustrates some of the various types of I/O for which the PDA and removable expansion card of FIG. 12 may be equipped. Application-specific functions may include special-function digital, analog, and mixed-signal electronics; specialfunction I/O; special-function data-pumps; and specialfunction accelerators.

Expansion Module Based O/S Related Functions

Techniques are known in the art for making and using systems that perform O/S related functions in conjunction with expansion modules. These techniques include: software enabled hot-swapping of expansion modules; auto launch of application programs specific to the inserted module; and "plug and play" ease of use via dynamic load of associated drivers on module insertion and dynamic unload of the associated drivers on module removal. Preferred embodiments of the application specific expansion cards discussed herein will generally make use of these O/S related techniques. Unlike prior art systems, systems designed in accordance with the present invention will generally need to manage both I/O and memory device drivers.

Modes of Use and Potential for Increased Parallelism

Removable expansion modules according to the present invention may operate in a number of different modes. At a basic level, they may be used solely to interface an external peripheral to the host device via the I/O connector, they may be used solely to interface with a second-level-removable expansion memory with the host device, and they may be used to simultaneously interface the host device with both an external peripheral and an expansion memory.

Figure 42:
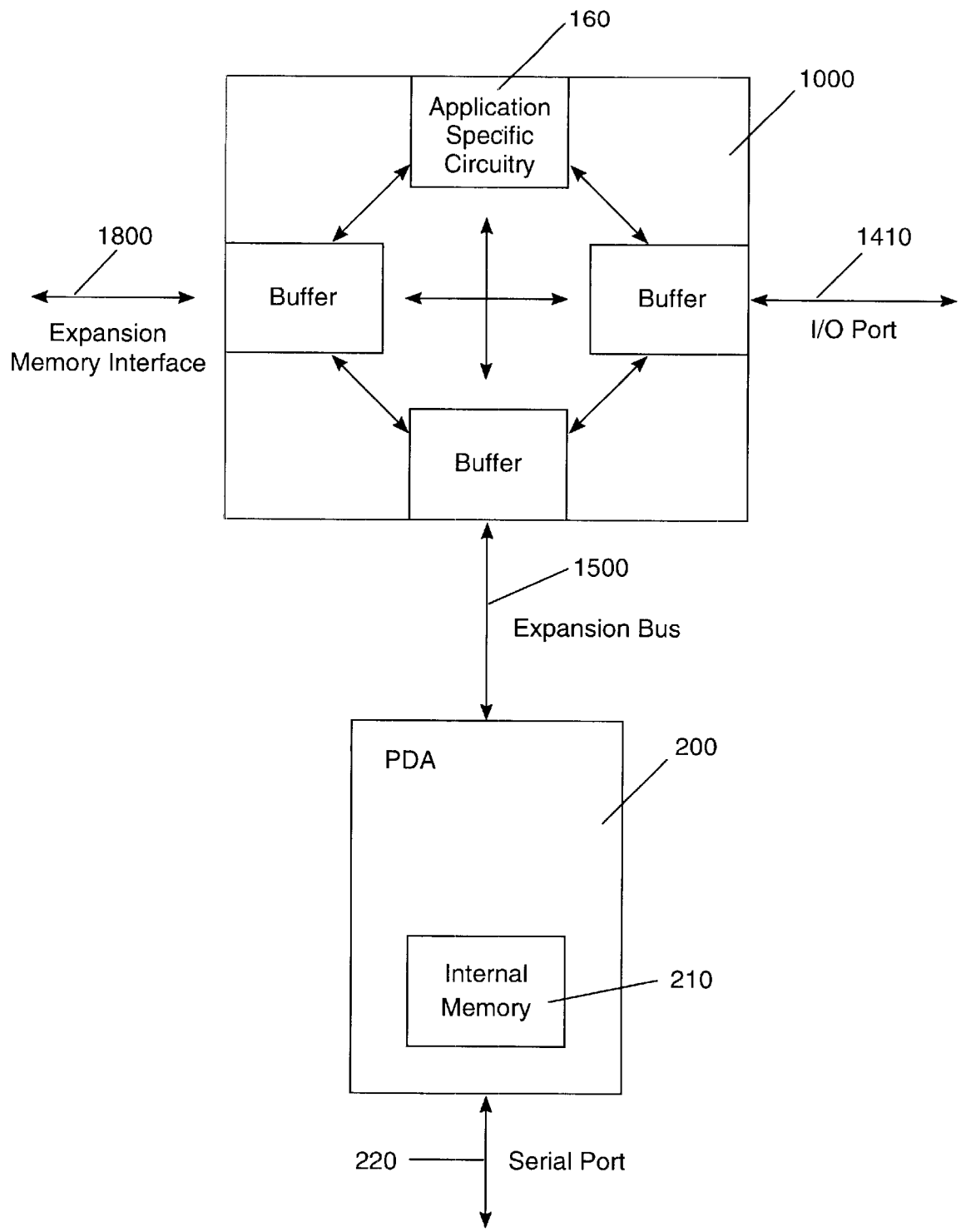

At a more general level, more advanced modes of operation are also possible. In a specific, but not limiting illustrative embodiment, FIG. 42 shows a PDA and an expansion module in operation; application specific circuitry; and data buffers at each of the I/O, expansion bus, and expansion memory interfaces. Each of the data buffers generally has one or more stages of FIFO storage for each data path coupled to each buffer. The inclusion of any of the data buffers, the extent of FIFO buffering, the existence of any particular one of the data paths, and management of bridging transfers by the circuitry in the expansion module, are specific to a given application.

Prior art PDAs 200 (or 250) have limited modes of use and can generally effect significant data transfers only between any of their integral main memory 210, integral serial port 220, and integral expansion module bus 1500. The addition of prior art expansion modules to PDAs does not alter the number of significant data transfer paths or number of significant simultaneous data transfers. Clearly, the expansion module 1000 of FIG. 42 greatly increases the potential system-level parallelism over that of the prior-art.

Application Specific Embodiments

Generic Removable Media Applications

The present invention enables general-purpose portable hosts to perform application-specific functions requiring dedicated ROM. A first large ROM-based application category is that of prerecorded media, such as music, audio, video, and text (for books, newspapers, and other publications). A second large ROM-based application category is customization for programmable devices, such as games, language translators, and other devices having "personality" modules.

The present invention also enables general-purpose portable hosts to perform application-specific functions requiring non-volatile read/write memory for data-capture, data-logging, data-checkpoints or backups, transaction logging, and data-transport.

In the illustrated embodiments the non-volatile read/write memory is flash memory in accordance with the standard MultiMediaCard. Such removable flash-memory-based application-specific functions have particular utility to medical and other data acquisition, secure commerce, financial and personal productivity devices making use of unique removable memories for each of multiple individuals, projects, or accounts.

The removable flash-based memory is also well suited where "sneaker-net" is a viable data transport. Provided manual/user intervention is acceptable, and depending on the speed of data link I/O incorporated into the expansion card, the physical transport of a removable memory device between a PDA-based expansion card and an external system may provide the best solution to fast local transport of large data-sets. For similar reasons, the use of removable memory devices may provide the best solution to rapidly reconfiguring an application-specific expansion card to initiate a large program or use a large data sets. The use of labeled, colorcoded, or otherwise distinctive, removable memory devices also may provide the best solution for ease of use for users needing to select a particular program or data set from many for reconfiguring an application specific expansion card.

Specific Application Examples
Media Player Application

The present invention permits a general purpose PDA to be customized (specially adapted) for use as a portable/wearable media player, at the highest-level of functionality not unlike a portable Compact Disk player. Such a player uses the removable memory to store and playback digitally encoded media such as music, audio, or video. In a preferred embodiment the player makes use of the MPEG Layer 3 standard for digital audio encoding, generally known as MP3. Another embodiment makes use of the Microsoft Digital Audio standard. Other aspects of a preferred embodiment include an integral AM/FM receiver, a connector for a headset with an integral antenna for the receiver, and an auto-start on insert feature that initiates the media playback upon insertion of the removable memory. The PDA's display/input-tablet provides the virtual controls and visual indicators for the media player.

Module for Subscriber Services

In accordance with the present invention, an expansion card having I/O and removable memory is inserted into a computer host. The I/O is coupled to a receiver capable of receiving a large number of broadcast messages and services. The removable memory contains subscriber services information for each individual user. The expansion card uses the subscriber services information to filter out messages and services not applicable to the present status of the subscriber. The PDA's display/input-tablet provides the virtual controls and visual indicators for the display and access of captured messages and services.

Bar-Code Scanning Application (A Backup Storage Example)

In accordance with the present invention, an expansion card having I/O and removable memory is inserted into a computer host, a bar-coding peripheral is connected to the I/O portion of the card, and a removable memory card is inserted into the memory slot of the card. After each scan the scanned information is transferred through the I/O connection to the host computer for processing. Additionally, a backup copy of the scanned information is stored on the removable memory. Should the computer host fail or should the operator need to verify scans, the backup can be interrogated with the same or a different host.

Personal Environmental and Medical Monitoring Devices

The present invention permits a general purpose PDA to be customized as a portable/wearable personal environmental monitor. Equipped with the appropriate sensors and application-specific circuitry for sensor signal processing, such a device performs time-stamped data logging of environmental attributes such as ionizing radiation, temperature, and humidity. Similarly, a portable/wearable personal medial monitor data logs health-related attributes such as pulse, temperature, respiration, and blood pressure. The PDA's display/input-tablet provides the virtual controls and visual indicators for the monitoring devices.

Automotive and Industrial Diagnostic Monitoring and Control

The combined I/O interconnect and removable memory of the present invention also permits a general purpose PDA to be customized (specially adapted) for use as a data logging diagnostic monitor or time-based control device. It is known that the diagnostic connectors of certain vehicles can be adapted to interface with PDAs for real-time monitoring of critical vehicle subsystems. The present invention permits such diagnostic monitoring data to be communicated via the I/O interconnect and logged to the removable memory. Such a tool facilitates tracking subsystem performance over extended periods of time, and permits real-time and deferred graphics of time-varying system performance attributes. The PDA's display/input-tablet provides the virtual controls and visual indicators for the diagnostic monitor.

Miscellaneous Applications

Another example application is wireless-modem based (I/O serial data-com link to cell-phone) Web-browsing (digital modem data transferred over expansion bus interface) while simultaneously playing back stored music (data from expansion memory interface transfered over expansion bus interface). A final example application is receiving location data (I/O data-com link to GPS receiver), retrieving map data (via expansion memory interface), and PDA display of integrated map and location data (I/O and memory data transferred over expansion bus interface).

Conclusion

Although the present invention has been described using particular illustrative embodiments, it will be understood that many variations in construction, arrangement and use are possible within the scope of the invention. For example the number of I/O interconnects, removable memories, contact fingers, number and type of application-specific circuits, and the size, speed, and type of technology used may generally be varied in each component of the invention.

The invention is further not limited to the specific expansion module technology of the illustrative embodiments. In specific but not limiting examples, the invention is equally applicable to any of the present and future variants of the CompactFlash (including any of the Type I, Type II, and proposed Type III variants), PC Card (including any of the 32-bit, 16-bit, Type I, Type II, and Type III variants), and Springboard (or other open-back expansion module) standards, as well as other removable expansion module standards and technologies.

Nor is the invention limited to a specific number and type of expansion I/O connector and I/O signaling as used in the illustrative embodiments. The invention is equally applicable to the use of multiple I/O connectors of one or more connector types. In addition, various and multiple types of I/O signaling may be employed.

Nor is the invention's second-level removable expansion memory limited to the MultiMediaCard expansion memory standard of the illustrative embodiments, but is equally applicable to use of other types of second-level removable memory or media. In specific but not limiting examples, the invention is equally applicable to the use of present and future variants of MMCs, Miniature Cards, SSFDCs, Smart Cards, and SIM Cards.

At the system level, the invention is not limited to the illustrated embodiments in which a removable expansion module with second-level-removable expansion memory is directly plugged into a computing host, but is equally applicable to situations in which one or more intervening adapters or dongles is used to adapt or couple between the interfaces of the expansion module and a computing host device or system. In a specific but not limiting example, the invention is applicable to the use of a CF Card with a CF-to-PC Card adapter, so that a CF Card according to the present invention can operate indirectly in a PC Card slot.

At the system level, the invention is also not limited to the illustrated embodiments in which a removable expansion module with second-level-removable expansion memory is used in a PDA, but is equally applicable to use in any host device or system benefiting from the use of a removable expansion module having second-level-removable expansion memory. In specific but not limiting examples, the invention is equally applicable to present or future variants of desktops, servers, workstations, network computers, laptops, notebooks, palmtops, handheld computers (handhelds), information appliances, audio recording and playback devices, imaging devices including scanners and digital cameras, video recorders, fax machines, copy machines, smart phones, point-of-sale terminals, bar-code scanners, other special purpose data-acquisition devices, printers, other special purpose data-output devices, communication systems, network interface or networking infrastructure devices operating at any one or more levels of a datacommunications protocol stack, network systems including any of the foregoing devices, and systems implementing networks and network applications at any scale including networks characterized as local area, departmental, enterprise wide, metropolitan area, state wide, regional, national, and the Internet.

More generally, functionally equivalent techniques, now known or that become known to those skilled in the art, may be employed to implement various components in place of those illustrated. The present invention is thus to be construed as including all possible modification and variations encompassed within the scope of the appended claims.

We claim:

1. An assembly for both interfacing with an external I/O subsystem and for receiving a removable expansion module of a first type, said module having first and second major sides, two minor sides, and an insertion end, said assembly comprising:
   a) a printed circuit board (PCB);
   b) an I/O connector mounted on said PCB for electrical coupling between said PCB and said external I/O subsystem, said I/O connector further serving as a first brace for guiding and positioning said first major side of said module;
   c) a riser mounted on said PCB, said riser having module contacts for electrical coupling between said PCB and said module, said riser further serving as a second brace for guiding and positioning said first major side of said module;
   d) a bus connector mounted on said PCB;
   e) circuitry mounted on said PCB; and
   f) an outer frame having a shape conformed to fit said PCB, said I/O connector, and said bus connector; and
   wherein said assembly implements a removable expansion module of a second type, said module of said first type being at least partially insertable into said module of said second type.

2. The assembly of claim 1, wherein said module contacts are implemented using spring contact fingers.

3. The assembly of claim 1, wherein said removable expansion module is a removable memory.

4. The assembly of claim 1, further including a plurality of stops projecting upward from the riser, said stops including two side stops, and end stop, and a key stop.

5. The assembly of claim 1, further including at least one surface guiding and constraining said second major side of said module.

6. The assembly of claim 5, wherein said surface guiding and constraining said second major side of said module is provided by a panel cover.

7. The assembly of claim 2, wherein said riser further includes a first opposing pair of directing surfaces for guiding and positioning said minor sides of said module.

8. The assembly of claim 7, further wherein the riser includes an end stop surface and a key stop surface to insure that said module is properly keyed and mated with said spring contact fingers.

9. The assembly of claim 7, further including;
   a) a second opposing pair of directing surfaces for further guiding and constraining said minor sides of said module; and
   b) at least one surface guiding and constraining said second major side of said module.

10. The assembly of claim 9, wherein
    said surface gtiiding and constraining said second major side of said module is provided by a panel cover, and
    said second opposing pair of directing surfaces is provided by an outer frame, said outer frame having an opening above said I/O connector for insertion of said module and otherwise having a shape conformed to fit said PCB, said I/O connector, and said panel cover.

11. The assembly of claim 1, wherein said expansion module of a second type is readily coupled to a portable computing host via said bus connector.

12. The assembly of claim 11, wherein said coupling is via is at least partial insertion of said expansion module of a second type into said portable computing host.

13. The assembly of claim 11, wherein said portable computing host uses a closed-back industrial design (ID).

14. The assembly of claim 13, wherein said pottable computing host accepts expansion modules compatible with at least one CF+ expansion module type.

15. The assembly of claim 11, wherein said expansion module of a first type is compatible with at least one MMC type.

16. The assembly of claim 11, wherein said portable computing host uses an open-back industrial design (ID)).

17. The assembly or claim 16, wherein said portable computing host accepts expansion cards compatible with at least one Springboard expansion module type.

18. The assembly of claim 11, wherein said circuitry provides application specific support for a particular application having functionality that is carried out in part on said portable computing host and in part by said circuitry.

19. The assembly of claim 18, wherein said particular application is a network connectivity application, said I/O connector being selectively coupled to an external network, and said module of a first type providing storage for files downloaded from said external network.

20. The assembly of claim 19, wherein said coupling to said external network is via a cell phone.

21. The assembly of claim 19, wherein said downloads includes at least one email that is stored to non-volatile memory in said module of a first type.

22. The assembly of claim 19, wherein said downloads includes at least one media file that is stored to non-volatile memory in said module of a first type.

23. A removable expansion module of a first type with an internal slot for inserting a removable expansion module of a second type, said module of a first type comprising:
 a) a printed circuit board (PCB);
 b) an I/O connector mounted on the PCB;
 c) a first outside frame having an opening to permit and guide the insertion of said module of said second type above the I/O connector;
 d) a second outside frame; and
 e) a contact assembly mounted on the PCB, the assembly including a raised shelf having a set of contact fingers electrically coupled to said PCB, at least two side stops, and an end stop; and
 wherein the I/O connector, the first outside frame, and the contact assembly are cooperatively aligned so as to guide the insertion of said module of said second type within said module of said first type so as to mate with said contact fingers for electrically coupling said module of said second type with said PCB.

24. The removable expansion module of a first type of claim 23, wherein said contact assembly further includes a key stop to insure the proper orientation of said module of said second type.

25. The removable expansion module of a first type of claim 23, further including a first cover for said first outside frame.

26. The removable expansion module of a first type of claim 23, further including covers for both said first and second outside frames.

27. The removable expansion module of a first type of claim 23, wherein said module of a first type is compatible with a portable computing host that uses a closed-back industrial design.

28. The removable expansion module of a first type of claim 27, wherein said module of a first type is compatible with at least one CF+ expansion module type.

29. The removable expansion module of a first type of claim 23, wherein said module of a second type is of the MMC type.

30. The removable expansion module of a first type of claim 23, wherein said module of a second type is a removable memory.

31. The removable expansion module of a first type of claim 23, further including a host expansion bus connector mounted on said PCB for coupling to a host expansion bus, and wherein said PCB includes application specific circuitry.

32. The removable expansion module of a first type of claim 23, wherein said module of a first type is comparable with a portable computing host that uses an open-back industrial design.

33. The removable expansion module or a first type of claim 32, wherein said module of a first type is compatible with the Springboard open-back industrial design.

34. The removable expansion module of a first type of claim 32, wherein said module of a first type flush mounts with the case of said open-back portable computer host.

35. A method of transferring data, comprising:
 a) providing a network access device;
 b) providing a removable expansion module or a first type;
 c) providing a removable expansion module of a second type with an internal slot for receiving and operating with said module of a first type, said module of said second type comprising:
  i. a printed circuit board (PCB);
  ii. an I/O connector mounted on the PCB;
  iii. an outer housing portion with an opening to permit and guide the insertion of said module of said first type above the I/O connector;
  iv. a contact platform mounted on the PCB, the contact platform including a central planar region with a protruding set of contact fingers, the central region being partially bounded by a guard rim projecting from said central region, said guard rim insuring that said module of said first type is correctly received, said contact fingers being electrically coupled to said PCB;
  v. a host expansion bus connector mounted on said PCB for coupling to a host expansion bus; and
  wherein said PCB includes application specific circuitry coupled to said I/O connector, said contact fingers, and said host expansion bus connector;
 d) providing a poltable computing host having an associated slot for receiving and operating with said module of said second type;
 c) populating said associated slot of said portable computing host with said module of a second type;
 f) populating said module of a second type with said module of a first type;
 g) coupling said module of a second type to said network device;
 h) under control of said portable computing host, transferring set or data between said network access device and said application specific circuitry.
 i) under control of said portable computing host, transferring said set of data between said application specific circuitry and said module or a first type.

36. The method of claim 35, wherein the network access device is a cell phone.

* * * * *